United States Patent [19]

Aoike et al.

[11] Patent Number: 5,236,798
[45] Date of Patent: Aug. 17, 1993

[54] ELECTROPHOTOGRAPHIC LIGHT RECEIVING MEMBER HAVING A PHOTOCONDUCTIVE LAYER FORMED OF NON-SINGLE CRYSTAL SILICON MATERIAL AND A SURFACE LAYER CONTAINING POLYSILANE COMPOUND

[75] Inventors: Tatsuyuki Aoike; Koichi Matsuda; Keishi Saitoh; Mitsuyuki Niwa; Masafumi Sano, all of Nagahama; Hisami Tanaka, Yokohama, all of Japan

[73] Assignee: Canon Kabushiki Kaisha, Tokyo, Japan

[21] Appl. No.: 587,990

[22] Filed: Sep. 25, 1990

[30] Foreign Application Priority Data

Sep. 27, 1989 [JP] Japan .................................. 1-249021

[51] Int. Cl.⁵ .............................................. G03G 5/14
[52] U.S. Cl. .......................................... 430/66; 430/57
[58] Field of Search ............................. 430/57, 65, 66

[56] References Cited

U.S. PATENT DOCUMENTS

| | | | |
|---|---|---|---|
| 4,618,551 | 10/1986 | Stolka et al. | 430/58 |
| 4,772,525 | 9/1988 | Badesha et al. | 430/58 |
| 4,851,312 | 7/1989 | Yoshizawa et al. | 430/57 |
| 4,917,980 | 4/1990 | Badesha et al. | 430/66 |

*Primary Examiner*—John Goodrow
*Attorney, Agent, or Firm*—Fitzpatrick, Cella, Harper & Scinto

[57] ABSTRACT

An electrophotographic light receiving member comprising a substrate and a light receiving layer having a multi-layered structure disposed on said substrate, said light receiving layer comprising at least a photoconductive layer and a surface layer being stacked in this order from the side of said substrate, said photoconductive layer being formed of a non-single crystal material containing silicon atoms as the matrix and at least one kind of atoms selected from the group consisting of hydrogen atoms and halogen atoms, and said surface layer being formed of a polysilane compound having a weight average molecular weight of 6000 to 200000 and having at least an oxygen-free organic group selected from the group consisting of alkyl group, cycloalkyl group, aryl group and aralkyl group at the terminals.

3 Claims, 7 Drawing Sheets

ELECTROPHOTOGRAPHIC LIGHT RECEIVING MEMBER HAVING A PHOTOCONDUCTIVE LAYER FORMED OF NON-SINGLE CRYSTAL SILICON MATERIAL AND A SURFACE LAYER CONTAINING POLYSILANE COMPOUND

FIELD OF THE INVENTION

The present invention relates to an electrophotographic light receiving member having a photoconductive layer formed of a non-single crystal silicon material and a surface layer containing a specific polysilane compound, which exhibit an improved sensitivity to electromagnetic waves such as light (which herein means in a broad sense light such as ultraviolet rays, visible rays, infrared rays, X-rays and γ-rays).

BACKGROUND OF THE INVENTION

For the photoconductive material to constitute the light receiving layer of an electrophotographic light receiving member, it is required to be highly sensitive to light, exhibits a high S/N ratio [photocurrent (Ip)/darkcurrent (Id)], has absorption spectral characteristics compatible with the spectral characteristics of magnetic waves irradiated, has a quick responsiveness to light and has a desirable dark electric resistivity. Other than these, it is also required for said material to be not harmful to the human body.

As the material to meet the above requirements, there is known an amorphous silicon material (hereinafter referred to as "a—si). There have been proposed various electro-photographic light receiving members respectively having a light receiving layer composed of "a—si.

Shown in FIG. 2 is a typical constitution of such electrophotographic light receiving member which comprises a substrate 201 and a light receiving layer 202 disposed on said substrate, said light receiving layer being formed of "a—si. This electrophotographic light receiving member is prepared by forming a film comprising "a—si to be the light receiving layer 202 on the substrate 201 in accordance with a relevant film-forming method such as thermal-induced CVD method, plasma CVD method or sputtering method.

The known electrophotographic light receiving members respectively having a light receiving layer composed of "a—si (hereinafter referred to as "a—si electrophotographic light receiving members") are generally recognized as being satisfactory in electrical optical characteristics including dark electric resistivity, photosensitivity, photoresponsibility and photoconductivity, use-environmental characteristics, durability and economical stability.

However, there is still room for the "a—si electrophotographic light receiving members to be improved in terms of total electrophotographic characteristics.

Now, along with the spread of the electrophotographic copying machine in recent years, there are increased demands for heightening the copying speed, stabilizing and improving the quality of an image reproduced.

In order to comply with these demands, there have been made improvements in the exposure mechanism, development mechanism, transfer mechanism, fixing mechanism, etc. of the electrophotographic copying machine. As a result, there is now an increased demand for a further improvement in the electrophotographic characteristics of the electrophotographic light receiving member to be used in the electrophotographic copying machine.

For instance, when image formation using the electrophotographic light receiving member is continued for a long period of time to provide a volume of copies in the electrophotographic copying machine, the cleaning blade of said machine is worn to cause a reduction in the cleaning efficiency of said blade. When this happens, it becomes impossible to obtain a high quality image unless such cleaning blade is replaced by a new one. There are disadvantages in that it takes a certain period of time for the replacement during which image formation cannot be conducted and a certain amount of expense is unavoidable for the replacement since it is done usually by a repair man.

In view of this, there is an increased demand for a further improvement not only in the cleaning blade but also in the electrophotographic light receiving member.

In order to improve the light receiving member so as to comply with the foregoing demand, there have been made proposals to use hole transporting polysilane compounds, for example, as disclosed in U.S. Pat. No. 4,618,551 or U.S. Pat. No. 4,772,525.

Each of these U.S. patents mentions a photoresponsive imaging member (namely, electrophotographic light receiving member) which has the layer constitution comprising a photoconductive layer comprised of hydrogenated amorphous silicon (hereinafter referred to as "a—Si:H") and a surface layer comprised of a hole transporting polysilane compound.

However, any of said U.S. patents does not detail about said photoconductive layer comprised of a—Si:H but simply mentions it, and does not detail about the electrophotographic characteristics of said electrophotographic light receiving member.

As for the polysilane compound used in any of the foregoing U.S. patents, it is understood that said polysilane compound is such a compound that is obtained by subjecting dichlorosilane monomer to dehydrogenation with the use of a Na catalyst to thereby synthesize a polysilane, which is presumed to be accompanied by chlorine radical on its terminal group.

Thus, it is considered that the foregoing demand can not be satisfied by any of the foregoing U.S. patents.

SUMMARY OF THE INVENTION

The present inventors prepared a light receiving member comprising a substrate and a light receiving layer disposed on said substrate, said light receiving layer comprising a photoconductive layer composed of a—Si:H and a surface layer composed of a polysilane compound, in accordance with the manner described in U.S. Pat. No. 4,618,551 or U.S. Pat. No. 4,772,525, and evaluated the resultant electrophotographic light receiving member in various viewpoints.

As a result, it was found that the resultant electrophotographic light receiving member is not sufficient to comply with the foregoing demand.

Specifically, the following was found. That is, the polysilane compound used in any of the above U.S. patents unavoidably contains halogen (chlorine) radicals at its terminal groups since said polysilane compound is prepared by dehalogenation of dichlorosilane monomer with the use of a Na catalyst. The surface layer is formed of such polysilane compound. The resultant electrophotographic light receiving member does not stably provide a high quality image and causes undesirable unevenness in the density of an extremely minute image reproduced. It still causes reduction in the resolution necessary to reproduce upon environmental changes.

It is considered that these problems are caused chiefly by the surface layer formed of such polysilane compound containing halogen radicals, wherein mobility of photocarrier in the surface layer and injection efficiency of photocarrier between the surface layer and the photoconductive layer are hindered, and the quantity of moisture absorbed to the polysilane compound of the surface layer is varied depending upon changes in the relative humidity to cause changes in the characteristics of the surface layer such as its surface resistivity, its volume resistivity and the mobility of photocarrier therein and also changes in the injection efficiency of photocarrier between the surface layer and the photoconductive layer.

Now, one of the present inventors and one other person of CANON KABUSHIKI KAISHA previously developed new polysilane compounds having a weight-average molecular weight of 6000 to 200000 wherein all silicon groups are substituted by specific oxygen-free organic groups.

The present inventors jointly made studies on the possibility of solving the foregoing problems in the foregoing electrophotographic light receiving member wherein a polysilane compound is used and meeting the foregoing demand when said new polysilane compounds are used to prepare a a—Si electrophotographic light receiving member.

As a result, it was found that an electrophotographic light receiving member which comprises a substrate and a light receiving layer disposed on said substrate, said light receiving layer comprising a photoconductive layer formed of an amorphous material containing silicon atoms (Si) as the matrix and hydrogen atoms (H) or/and halogen atoms (X) [hereinafter referred to as "a—Si(H,X)"] and a surface layer formed of said specific polysilane compound, excels in electric characteristics, optical characteristics, photoconductive characteristics, image-forming characteristics, durability upon repeating use, and use-environmental characteristics, and stably provides high quality reproduced images being uniform in their density even in the case where an original containing extremely minute characters or patterns is used. It was also found that said electrophotographic light receiving member is capable of solving the foregoing problems in the prior art and meeting the foregoing demand.

The present invention has been accomplished based on the above findings.

An object of the present invention is to eliminate the foregoing problems in the known electrophotographic light receiving member wherein a polysilane compound is used, and to provide an improved electrophotographic light receiving member wherein a specific polysilane compound is used which stably provides high quality reproduced images.

Other object of the present invention is to provide an improved electrophotographic light receiving member having a photoconductive layer formed of a non-single crystal material containing silicon atoms as the matrix, and at least hydrogen atoms (H) or/and halogen atoms (X) (hereinafter referred to as "Non-Si(H,X)") and a surface layer containing a specific polysilane compound which is not affected by changes in the environment, excels in durability and stably provides high quality reproduced images.

A further object of the present invention is to provide an improved electrophotographic light receiving member having a photoconductive layer formed of a Non-Si(H,X) and a surface layer containing a specific polysilane compound having a weight-average molecular weight of 6000 to 200000 wherein all the silicon groups and terminal groups being substituted by specific oxygen-free organic groups, which excels in electric characteristics, optical characteristics, photoconductive characteristics, image-forming characteristics, durability upon repeating use, and use-environmental characteristics, and stably provides high quality reproduced images being uniform with their density even in the case where an original containing extremely minute characters or patterns is used.

DETAILED DESCRIPTION OF THE INVENTION

The electrophotographic light receiving member according to the present invention is characterized by comprising a substrate and a multi-layered light receiving layer disposed on said substrate. In a typical embodiment, the multi-layered light receiving layer comprises (i) a photoconductive layer comprised of a non-single crystal material containing silicon atoms (Si) as the matrix and at least one kind of atoms selected from the group consisting of hydrogen atoms (H) and halogen atoms (X) and (ii) a surface layer comprised of a specific polysilane compound having at least an alkyl group, cycloalkyl group, aryl group or aralkyl group at the terminals which will be later detailed.

The foregoing non-single crystal material includes amorphous materials (including microcrystal materials)

respectively containing silicon atoms (Si) as the matrix and at least hydrogen atoms (H) or/and halogen atoms (X) (hereinafter referred to as "a—Si(H,X)") and polycrystal materials respectively containing silicon atoms (Si) as the matrix and at least hydrogen atoms (H) or/and halogen atoms (X)(hereinafter referred to as "poly-Si(H,X)"). These a—Si(H,X) and poly-Si(H,X) will be hereinafter collectively referred to as "Non-Si(H,X)".

The electrophotographic light receiving member having the foregoing multi-layered light receiving layer according to the present invention excels in the electric characteristics, optical characteristics, photoconductive characteristics, durability, and use-environmental characteristics, and it stably and repeatedly provides high quality reproduced images being uniform in their density.

Particularly, as for the electrophotographic light receiving member according to the present invention, since it has the surface layer comprised of the foregoing specific polysilane compound on the photoconductive layer comprised of a Non-Si(H,X), there are remarkable advantages that the injection efficiency of photocarrier between the surface layer and the photoconductive layer is always maintained in a desirable state, the surface layer slightly absorbs moisture, the quantity of moisture absorbed to the surface layer is not varied even upon changes in the relative humidity, the characteristics of the surface such as surface resistivity and volume resistivity are stably maintained, and the mobility of photocarrier in the surface is improved. In addition to these advantages, the electrophotographic light receiving member according to the present invention excels in the durability against the cleaning means such as a cleaning blade of the electrophotographic copying machine. Thus, the electrophotographic light receiving member according to the present invention stably and uniformly exhibits desirable electrophotographic characteristics required for image-formation even upon changes in use-environmental conditions even upon repeating use for a long period of time to stably and repeatedly provide high quality reproduced images.

Figure 1:
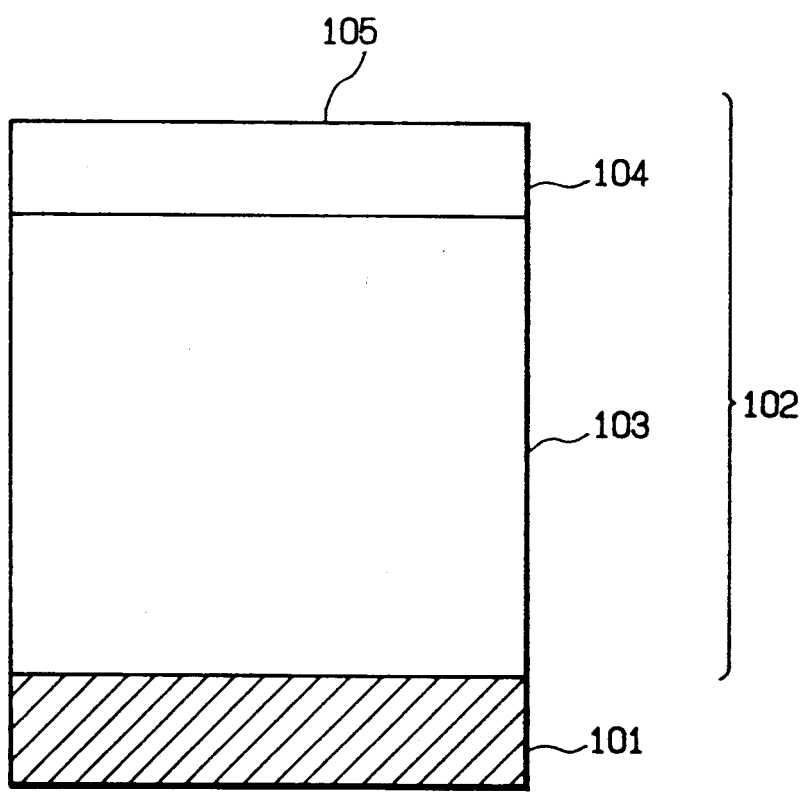
FIG. 1 is a schematic cross-sectional view illustrating a representative embodiment of the configuration of an electrophotographic light receiving member according to the present invention.
Figure 2:
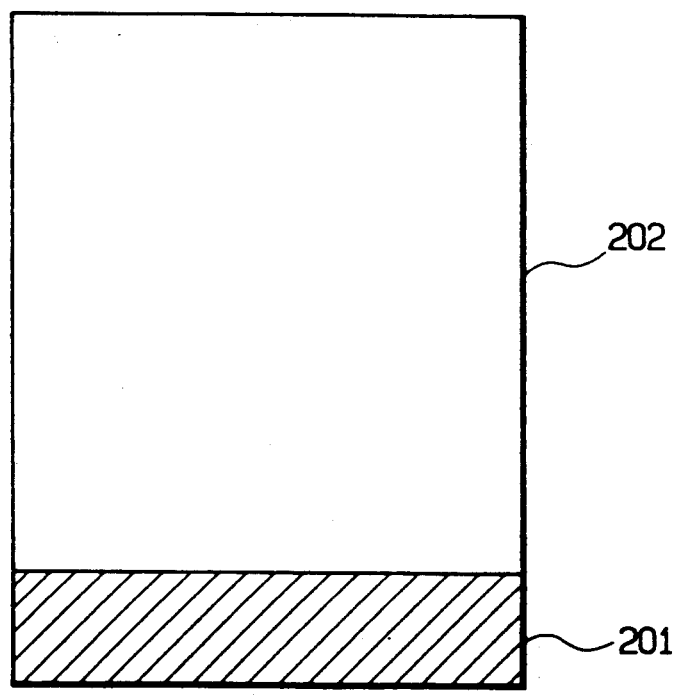
FIG. 2 is a schematic cross-sectional view illustrating the configuration of a known amorphous silicon electrophotographic light receiving member.

In a typical embodiment of the electrophotographic light receiving member according to the present invention takes such a configuration as schematically shown in FIG. 1.

The electrophotographic light receiving member shown in FIG. 1 comprises a substrate 101 and a light receiving layer 102 disposed on said substrate, said light receiving layer 102 comprising a photoconductive layer 103 comprised of a Non-Si(H,X) being disposed on the surface of the substrate 101 and a surface layer 104 comprised of the foregoing specific polysilane compound being disposed on the surface of the photoconductive layer 103, said surface layer having a free surface 105.

The electrophotographic light receiving member may further comprise a lower layer comprised of the same polysilane compound being disposed between the substrate 101 and the photoconductive layer 103.

In this case, there are advantages that the injection efficiency of photocarrier between the substrate and the photoconductive layer is further improved and influences due to the structural defects in the photoconductive layer are diminished, and as a result, further improved high quality images excelling in sharpness and without being accompanied with fogged images, dots, etc. can be stably and repeatedly provided.

In the following, explanation will be made for the substrate and each constituent layer in the electrophotographic light receiving member according to the present invention.

Substrate (101)

The substrate 101 may be either electroconductive or insulative. The electroconductive substrate can include, for example, metals such as NiCr, stainless steels, Al, Cr, Mo, Au, Nb, Ta, V, Ti, Pt and Pb or the alloys thereof.

The electrically insulative substrate can include, for example, films or sheets of synthetic resins such as polyester, polyethylene, polycarbonate, cellulose acetate, polypropylene, polyvinyl chloride, polyvinylidene chloride, polystyrene, and polyamide, glass, ceramic and paper.

It is preferred that the electrically insulative substrate is applied with electroconductive treatment to at least one of the surfaces thereof and disposed with a light receiving layer on the thus treated surface.

In the case of glass, for instance, electroconductivity is applied by disposing, at the surface thereof, a thin film made of NiCr, Al, Cr, Mo, Au, Ir, Nb, Ta, V, Ti, Pt, Pd, $In_2O_3$, $SnO_2$, ITO (($In_2O_3+SnO_2$), etc. In the case of the synthetic resin film such as a polyester film, the electroconductivity is provided to the surface by disposing a thin film of metal such as NiCr, Al, Ag, Pv, Zn, Ni, Au, Cr, Mo, Ir, Nb, Ta, V, Tl or Pt by means of vacuum deposition, electron beam vapor deposition, sputtering, etc., or applying lamination with the metal to the surface. The substrate may be of any configuration such as cylindrical, belt-like or plate-like shape, which can be properly determined depending on the application uses.

The thickness of the substrate member is properly determined so that the light receiving member as desired can be obtained. In the case where flexibility is required for the electrophotographic light receiving member, it can be made as thin as possible within the range capable of sufficiently providing the function as the substrate. However, the thickness is usually greater than 10 $\mu$m in view of the fabrication and handling or mechanical strength of the substrate.

In the case where the electrophotographic light receiving member of the present invention is employed in an image-forming system wherein image formation is performed with the use of coherent light such as laser beam, the surface of the substrate on which a light receiving layer is to be disposed is desired to be uneven in order to prevent occurrence of interference fringe patterns causing defects on images reproduced.

In order for the surface of the substrate to be provided with irregularities, the substrate may be processed by a known surface treating method disclosed in Japanese Unexamined Patent Publication No. 168156/1985, 178457/1985 or 225854/1985.

In a preferred embodiment in order to prevent occurrence of interference fringe patterns causing defects on images reproduced in the case where the electrophotographic light receiving member of the present invention is employed in the foregoing image-forming system using coherent light, the surface of the substrate is made to be of an uneven shaped surface provided with irregularities composed of a plurality of spherical dimples, the size of each of said spherical dimples being smaller than the resolution power required for the electrophotographic light receiving member.

Such surface-treated substrate having an uneven shaped surface provided with irregularities composed of minute spherical dimples can be prepared by a known surface treating method disclosed in Unexamined Japanese Patent Publication No. 231561/1986.

Photoconductive Layer (103)

The photoconductive layer 103 disposed on the substrate 101 in the electrophotographic light receiving member is basically composed of a Non-Si(H,X) which exhibits a desirable photoconductivity.

The photoconductive layer may contain at least one kind of atoms selected form the group consisting of atoms (M) of a conductivity controlling element, carbon atoms(C), nitrogen atoms (N), oxygen atoms (O), germanium atoms (Ge) and tin atoms (Sn) in the entire layer region.

Further, the photoconductive layer may be provided with a partial layer region containing at least one kind of atoms selected from the group consisting of atoms (M) of a conductivity controlling element, carbon atoms (C), nitrogen atoms, (N), oxygen atoms (O), germanium atoms (Ge) and tin atoms (Sn). In a preferred embodiment, the photoconductive layer is desired to contain the atoms (M) of a conductivity controlling element in its layer region adjacent to the substrate.

In any case, these atoms may be contained in the entire layer region or partial layer region of the photoconductive layer either in a state that they are distributed uniformly in the foregoing entire layer region or in the foregoing partial layer region or in a state that they are distributed uniformly in such layer region but unevenly in the thickness direction.

In any of these cases, it is necessary that they are uniformly and continuously distributed in the direction in parallel with the surface of the substrate, in order for the electrophotographic light receiving member to exhibit its electrophotographic characteristics uniformly in the direction in parallel with the surface of the substrate.

Further in addition, the photoconductive layer may be provided with a partial layer region containing atoms of at least a member selected from the group consisting of alkalai metals, alkaline earth metals and transition elements. In this case, these atoms may be contained in said layer region either in a state they are distributed uniformly in the entire of said layer region or in a state that they are distributed uniformly in such layer region but unevenly in the thickness direction.

In any of these cases, it is necessary that they are uniformly and continuously distributed in the direction in parallel with the surface of the substrate, in order for the electrophotographic light receiving member to exhibit its electrophotographic characteristics uniformly in the direction in parallel with the surface of the substrate.

As for the layer region containing at least one kind of atoms selected form carbon atoms (C), nitrogen atoms (N) and oxygen atoms (O) (hereinafter referred to as "atoms (C,N,O)") (this layer region will be hereinafter referred to as "layer region (CNO)"), the layer region containing germanium atoms (Ge) or/and tin atoms (Sn) (hereinafter referred to as "atoms (Ge,Sn)") (this layer region will be hereinafter referred to as "layer region (GS)"), the layer region containing atoms (M) of a conductivity controlling element (hereinafter referred to as "atoms (M)") (this layer region will be hereinafter referred to as "layer region (M)"), and the layer region containing atoms of at least a member selected from the group consisting of alkali metals, alkaline earth metals and transition elements (hereinafter referred to as "atoms (A,T)") (this layer region will be hereinafter referred to as "layer region (AT)"), these layer regions may be substantially identical or partially overlapped or substantially not overlapped.

As the atoms (M), so-called impurities in the field of the semiconductor can be mentioned. Specifically, there can be mentioned atoms of an element belonging to group III of the periodic table (hereinafter referred to as "group III element") which provides a p-type conductivity, atoms of an element belonging to group V of the periodic table (hereinafter referred to as "group V element") which provides an n-type conductivity, and atoms of an element belonging to group VI of the periodic table (hereinafter referred to as "group VI element").

Examples of the group III element are B, Al, Ga, In and Tl. Among these elements, B, Al and Ga are most desirable.

Examples of the group V element are N, P, As, Sb and Bi. Among these elements, P and As are most desirable.

Examples of the group VI element are O, S, Se, Te and Po. Among these elements, S and Se are most desirable.

In the case of incorporating oxygen atoms (O) or nitrogen atoms (N) into the layer region as the atoms (M), the oxygen (O) or nitrogen (N) atoms not only serve to impart the corresponding conductivity to the layer but also bring about the later described effects provided when the atoms (O,N) are incorporated.

The provision of the layer region (M) in the photoconductive layer brings about effects of controlling the conduction type or/and the conductivity and improving the charge injection efficiency between the layer region (M) and other layer region situated above said layer region (M). The amount of the atoms (M) to be incorporated into the layer region (M) is preferably in the range of from $1 \times 10^{-3}$ to $5 \times 10^4$ atomic ppm, more preferably in the range of from $1 \times 10^{-2}$ to $1 \times 10^4$ atomic ppm, most preferably in the range of from $1 \times 10^{-1}$ to $5 \times 10^3$ atomic ppm It is possible for the layer region (M) to contain atoms (C,N,O). In this case, when the atoms (C,N,O) are incorporated there into in an amount of less than $1 \times 10^3$ atomic ppm, the amount of the atoms (M) to be incorporated thereinto is desired to be in the range of from $1 \times 10^{-1}$ $1 \times 10^3$ atomic ppm.

Likewise, when the atoms (C,N,O) are incorporated in an amount exceeding $1 \times 10^3$ atomic ppm, the amount of the atoms (M) is desired to be in the range of from $1 \times 10^{-1}$ to $5 \times 10^4$ atomic ppm.

The provision of the layer region (CNO) in the photoconductive layer brings about effects of providing a desirable dark resistivity and a desirable hardness to the photoconductive layer, controlling the spectral sensitivity of the photoconductive layer, and improving the adhesion between the layer region (CNO) and other layer region.

The amount of the atoms (C,N,O) to be incorporated into the layer region (CNO) is preferably in the range of from 1 to $9 \times 10^5$ atomic ppm, more preferably in the range of from 10 to $5 \times 10^5$ atomic ppm, most preferably in the range of from $1 \times 10^2$ to $3 \times 10^5$ atomic ppm.

Particularly, in the case of aiming at providing a high dark resistivity and/or a high hardness to the photoconductive layer, the amount of the atoms (C,N,O) to be incorporated is desired to be in the range of from $1 \times 10^3$ to $9 \times 10^5$ atomic ppm. Further, in the case of aiming at controlling the spectral sensitivity of the photoconductive layer, the amount of the atoms (C,N,O) is desired to be in the range of from $1 \times 10^2$ to $5 \times 10^5$ atomic ppm.

The provision of the layer region (GS) in the photoconductive layer brings about effects of controlling the spectral sensitivity (especially, improving the sensitivity to long wavelength light), preventing occurrence of interference phenomena and improving the adhesion between the layer region (GS) and other layer region.

The amount of the atoms (Ge,Sn) to be incorporated into the layer region (GS) is preferably in the range of from 1 to $9.5 \times 10^5$ atomic ppm, more preferably in the range of from $1 \times 10^2$ to $8 \times 10^5$ atomic ppm, most preferably in the range of from $5 \times 10^2$ to $7 \times 10^5$ atomic ppm.

As the halogen atom (X) to be contained in the foregoing Non-Si(H,X) to constitute the photoconductive layer, there can be mentioned F, Cl, Br and I. The hydrogen atoms (H) and/or halogen atoms (X) contained in the Non-Si(H,X) serve to compensate dangling bonds of the silicon atoms, whereby improving the quality of the photoconductive layer.

The amount of the hydrogen atoms (H) or the sum (H,X) of the amount of the hydrogen atoms (H) and the amount of the halogen atoms (X) to be incorporated in the photoconductive layer is preferably in the range of from $1 \times 10^3$ to $7 \times 10^5$ atomic ppm. As for the amount of the halogen atoms (X) to be incorporated into the photoconductive layer, it is desired to be in the range of from 1 to $4 \times 10^5$ atomic ppm. Further, as for the amount of the hydrogen atoms (H) or the sum(H+X) of the amount of the hydrogen atoms (H) and the amount of the halogen atoms (X) to be incorporated into the photoconductive layer when the atoms (C,N,O) are incorporated into said layer in an amount of less than $3 \times 10^5$ atomic ppm, it is desired to be in the range of from $1 \times 10^3$ to $4 \times 10^5$ atomic ppm.

In a preferred embodiment in the case where the photoconductive layer is composed of a poly-Si(H,X) material, the amount of the hydrogen atoms (H) or the sum(H+X) of the amount of the hydrogen atoms (H) and the amount of the halogen atoms (X) to be contained in the photoconductive layer, it is desired to be in the range of from $1 \times 10^3$ to $2 \times 10^5$. Likewise, in a preferred embodiment in the case where the photoconductive layer is composed of a a—Si(H,X) material, the amount of the hydrogen atoms (H) or the sum(H.X) of the amount of the hydrogen atoms(H) and the amount of the halogen atoms(X) to be contained in the photoconductive layer is desired to be in the range of from $1 \times 10^4$ to $7 \times 10^5$ atomic ppm.

The provision of the layer region (AT) in the photoconductive layer brings about effects of reducing defects in said layer and further improving the stability thereof.

As the atoms (A,T), there can be mentioned atoms of Na, atoms of Mg, atoms of Y, atoms of Mn, atoms of Zn, atoms of Ca, atoms of Cr, atoms of Fe and atoms of Ni.

As for the amount of the atoms (A,T) to be incorporated into the layer region (AT), it is preferably in the range of from $1 \times 10^{-3}$ to $1 \times 10^4$ atomic ppm, more preferably in the range of from $1 \times 10^{-2}$ to $1 \times 10^3$ atomic ppm, most preferably in the range of from $5 \times 10^{-2}$ to $5 \times 10^2$ atomic ppm. Particularly, as for the amount of Na atoms, Mg atoms, Cr atoms, Cr atoms, Fe atoms or Ni atoms to be incorporated into the layer region (AT), it is desired to be in the range of from $1 \times 10^{-2}$ to $9 \times 10^{-1}$ atomic ppm.

The thickness of the photoconductive layer of the electrophotographic light receiving member according to the present invention is an important factor for effectively attaining the objects of the present invention.

It is appropriately determined depending upon the desired purpose.

It is, however, necessary that the layer thickness be determined in view of relative and organic relationships in accordance with the amounts of silicon atoms(Si), hydrogen atoms(H), halogen atoms(X), the atoms(M), the atoms(C,N,O), the atoms(Ge,Sn), and the atoms-(A,T) to be contained therein and the characteristics required in relationship with the thickness of the surface layer.

Further, it should be determined also in economical viewpoints such as productivity or mass productivity.

In view of the above, the thickness of the photoconductive layer is preferably 1 to 130 $\mu$m, more preferably 3 to 100 $\mu$m, most preferably 5 to 60 $\mu$m.

The photoconductive layer composed of the foregoing Non-Si(H,X) material in the electrophotographic light receiving member according to the present invention can be formed by a known vacuum film-forming method, wherein the related film-forming parameters are properly adjusted.

As such vacuum film-forming method, there can be mentioned a glow discharging method such as AC glow CVD method e.g. low frequency CVD method and high frequency CVD method, and DC glow CVD method, an ECR-CVD method, a sputtering method, a vacuum evaporation method, an ion plating method, and a photo CVD method. Other than these methods, it is possible to use a so-called HR-CVD method wherein active species (A) produced by the decomposition of a raw material gas and active species (B) resulted from a film-forming chemical compound which are reactive with said active species (A) are separately introduced into a film-forming chamber wherein they are chemically reacted to form a film on a substrate. It is also possible to use a so-called FO-CVD method wherein a film-forming raw material gas and halogen gas capable of chemically reacting with said raw material gas are separately introduced into a film-forming chamber wherein they are chemically reacted to formed a film on a substrate.

These methods can be used selectively depending on the factors such as the manufacturing conditions, the installation cost required, production scale and properties required for the light receiving members to be prepared.

Among these methods, the glow discharging method, sputtering method, ion plating method, HR-CVD method and FO-CVD method are suitable since the control for the condition upon preparing the layers having desired properties are relatively easy, and hydrogen atoms, halogen atoms and other atoms can be introduced easily together with silicon atoms. These methods may be used together in one identical system.

For instance, when a layer composed of a Non-Si(H,X) material by the glow discharging method, raw material gas capable of supplying silicon atoms (Si) is introduced together with raw material gas capable of introducing hydrogen atoms (H) or/and halogen atoms (X) into a deposition chamber, the inside pressure of which can be reduced, glow discharge is generated in the deposition chamber, and a layer composed of Non-Si(H,X) is formed on the surface of a substrate placed in the deposition chamber.

In the case of incorporating the atoms (M), the atoms (C,N,O), the atoms (Ge,Sn) or the atoms (A,T) into said layer, appropriate raw material capable of supplying such atoms is introduced into the deposition chamber at the time of forming the Non-Si(H,X) layer.

The gas pressure (inner pressure) of the deposition chamber, the substrate temperature and the electrical discharging power upon forming a desirable Non-Si(H,X) film to be the photoconductive layer by the glow discharging method are necessary to be properly determined as desired.

In general, as for the inner pressure, it is preferably in the range of from $1 \times 10^{-5}$ to 10 Torr, more preferably in the range of from $1 \times 10^{-4}$ to 3 Torr, most preferably in the range of from $1 \times 10^{-4}$ to 1 Torr. As for the substrate temperature, in the case of forming a a—Si(H,X) film as the Non-Si(H,X) film, it is preferably in the range of from 50° to 400° C., most preferably in the range of from 100° to 300° C.

In order to form a poly-Si(H,X) film as the Non-Si(H,X) film, film-formation is performed while maintaining a substrate at a temperature of 400° to 600° C.

In an alternative, the photoconductive layer comprising a poly-Si(H,X) film may be formed by firstly forming an amorphous film on a substrate maintained at about 250° C. by the glow discharging method and then, subjecting said amorphous film to annealing treatment to thereby form a polycrystal film.

The above annealing treatment can be carried out by subjecting the amorphous film formed on the substrate to heat treatment at a temperature of 400° to 600° C. for 5 to 30 minutes or by irradiating said amorphous film with laser beam for 5 to 30 minutes.

As for the electrical discharging power to be applied into the deposition chamber upon forming the photoconductive layer comprising a Non-Si(H,X) film by the glow discharging method, it should be properly determined depending upon the kinds of film-forming raw material gases to be used and other related conditions. However, in general, it is preferably in the range of from $5 \times 10^{-5}$ to 10 W/cm$^3$, more preferably in the range of from $5 \times 10^{-4}$ to 5 W/cm$^3$, most preferably in the range of from $1 \times 10^{-3}$ to $2 \times 10^{-1}$ W/cm$^3$.

However, the actual conditions for forming the photoconductive layer such as substrate temperature, electric discharging power and gas pressure in the deposition chamber cannot usually be determined with ease independent of each other. Accordingly, the conditions optimal to the layer formation are desirably determined based on relative and organic relationships for forming the photoconductive layer having desired properties.

Basically, when a layer composed of Non-Si(H,X) is formed, for example, by the glow discharging method, gaseous starting material for supplying Si capable of supplying silicon atoms(Si) are introduced together with gaseous starting material capable of supplying hydrogen atoms(H) and/or halogen atoms(X) into a deposition chamber the inside pressure of which can be reduced, glow discharge is generated in the deposition chamber, and a layer composed of Non-Si(H,X) is formed on the surface of a predetermined substrate disposed previously at a predetermined position.

The gaseous starting material capable of supplying Si can include gaseous or gasifiable silicon hydrides (silanes) such as SiH$_4$, Si$_2$H$_6$, Si$_3$H$_8$, Si$_4$H$_{10}$, etc., SiH$_4$ and Si$_2$H$_6$ being particularly preferred in view of the easy layer forming work and the good efficiency for the supply of Si.

These gaseous starting materials can be diluted with a dilution gas such as H$_2$, He, Ar, Ne, etc. upon their introduction into the deposition chamber, in case where necessary.

As the gaseous starting material capable of supplying halogen atoms(X), there can be mentioned various gaseous or gasifiable halogen compounds such as halogen gases, halides, inter-halogen compounds and halogen-substituted silane derivatives. Other than these, there can be also mentioned gaseous or gasifiable silicon hydrides containing halogen atom.

Specifically, they can include halogen gas such as of fluorine, chlorine, bromine, and iodine; inter-halogen compounds such as BrF, ClF, ClF$_3$, BrF$_2$, BrF$_3$, IF$_7$, ICl, IBr, etc.; and silicon halides such as SiF$_4$, Si$_2$F$_6$, SiCl$_4$, and SiBr$_4$.

The use of the gaseous or gasifiable silicon halide as described above is particularly advantageous since the layer composed of Non-Si(H,X) can be formed with no additional use of the gaseous starting silicon hydride material for supplying Si.

In the case of forming the photoconductive layer composed of a non-single crystal silicon material containing halogen atoms by the glow discharging method, typically, a mixture of a gaseous silicon halide substance as the starting material for supplying Si and a gas such as Ar, H$_2$ and He is introduced into the deposition chamber having a substrate in a predetermined mixing ratio and at a predetermined gas flow rate, and the thus introduced gases are exposed to the action of glow discharge to thereby cause a gas plasma resulting in forming said layer on the substrate.

And, for structurally incorporating hydrogen atoms in said layer, an appropriate gaseous starting material for supplying hydrogen atoms can be additionally used.

Now, the gaseous starting material usable for supplying hydrogen atoms can include those gaseous or gasifiable materials, for example, hydrogen gas (H$_2$), halides such as HF, HCl, HBr, and HI, silicon hydrides such as SiH$_4$, Si$_2$H$_6$, Si$_3$H$_8$, and Si$_4$H$_{10}$, or halogen-substituted silicon hydrides such as SiH$_2$F$_2$, SiH$_2$I$_2$, SiH$_2$Cl$_2$, SiHCl$_3$, SiH$_2$Br$_2$, and SiHBr$_3$. The use of these gaseous starting materials is advantageous since the content of hydrogen atoms (H), which are extremely effective in controlling the electrical or photoelectronic properties, can be controlled with ease. Then, the use of the hydrogen halide or the halogen-substituted silicon hydride as described above is particularly advantageous since the hydrogen atoms (H) are also introduced together with the introduction of the halogen atoms.

The amount of the hydrogen atoms (H) and/or the amount of the halogen atoms (X) to be contained in a layer are adjusted properly by controlling related conditions, for example, the temperature of a substrate, the amount of a gaseous starting material capable of supplying hydrogen atoms or halogen atoms into the deposition chamber and the electric discharging power.

In the case of forming the photoconductive layer composed of Non-Si(H,X) by the reactive sputtering process, the layer is formed on a substrate by using an Si target and sputtering the Si target in a plasma atmosphere.

To form said layer by the ion-plating process, the vapor of silicon is allowed to pass through a desired gas plasma atmosphere. The silicon vapor is produced by heating polycrystal silicon or single crystal silicon held in a boat. The heating is accomplished by resistance heating or electron beam method (E.B. method).

In either case where the sputtering process or the ion-plating process is employed, the layer may be incorporated with halogen atoms by introducing one of the above-mentioned gaseous halides or halogen-containing silicon compounds into the deposition chamber in which a plasma atmosphere of the gas is produced. In the case where the layer is incorporated with hydrogen atoms in accordance with the sputtering process, a feed gas to liberate hydrogen is introduced into the deposition chamber in which a plasma atmosphere of the gas is produced. The feed gas to liberate hydrogen atoms includes $H_2$ gas and the above-mentioned silanes.

For the formation of the photoconductive layer composed of Non-Si(H,X) in accordance with the glow discharging process, reactive sputtering process or ion plating process, the foregoing halide or halogen-containing silicon compound can be effectively used as the starting material for supplying halogen atoms. Other effective examples of said material can include hydrogen halides such as HF, HCl, HBr and HI and halogen-substituted silanes such as $SiH_2F_2$, $SiH_2I_2$, $SiH_2Cl_2$, $SiHCl_3$, $SiH_2Br_2$ and $SiHBr_3$, which contain hydrogen atom as the constituent element and which are in the gaseous state or gasifiable substances. The use of the gaseous or gasifiable hydrogen-containing halides is particularly advantageous since, at the time of forming the layer, the hydrogen atoms, which are extremely effective in view of controlling the electrical or photoelectrographic properties, can be introduced into that layer together with halogen atoms.

The structural introduction of hydrogen atoms into the layer can be carried out by introducing, in addition to these gaseous starting materials, $H_2$, or silicon hydrides such as $SiH_4$, $SiH_6$, $Si_3H_6$, $Si_4H_{10}$, etc. into the deposition chamber together with a gaseous or gasifiable silicon-containing substance for supplying Si, and producing a plasma atmosphere with these gases therein.

For example, in the case of the reactive sputtering process, the layer composed of Non-Si(H,X) is formed on the substrate by using an Si target and by introducing a halogen atom introducing gas and $H_2$ gas, if necessary, together with an inert gas such as He or Ar into the deposition chamber to thereby form a plasma atmosphere and then sputtering the Si target.

The control of the amounts for hydrogen atoms (H) and halogen atoms (X) to be incorporated in the layer can be carried out by controlling the temperature of a substrate, the amount of the starting material for supplying hydrogen atoms and/or halogen atoms to be introduced into the deposition chamber, discharging power, etc.

In the case of structurally introducing the foregoing atoms(M) into a Non-Si(H,X) film to be formed in order to form the photoconductive layer, a gaseous starting material capable of supplying atoms of the foregoing group III, V or VI element is introduced together with the foregoing gaseous starting materials upon forming said film. As such starting material, there is used a gaseous or easily gasifiable material. Usable as the starting material for introducing atoms of the group III element are, for example, boron hydrides such as $B_2H_6$, $B_4H_{10}$, $B_5H_9$, $B_5H_{11}$, $B_6H_{10}$, $B_6H_{12}$, and $B_6H_{14}$ boron halides such as $BF_3$, $BCl_3$, and $BBr_3$: other than these, $AlCl_3$, $Al(CH_3)_3$, $CaCl_3$, $Ga(CH_3)_3$, $InCl_3$, $TlCl_3$, etc.

Usable as the starting material for introducing atoms of the group V element are, for example, phosphorus hydrides such as $PH_3$ and $P_2H_6$ phosphorus halides such as $PH_4I$, $PF_3$, $PF_5$, $PCl_3$, $PCl_5$, $PBr_3$, $PBr_5$, and $PI_3$: other than these, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, etc.

As the starting material usable for introducing atoms of the group VI element, there can be mentioned $H_2S$, $SF_4$, $SF_6$, $SO_2$, $SO_2F_2$, COS, $CS_2$, $CH_3SH$, $C_2H_5SH$, $C_4H_4S$, $(CH_3)_2S$, $(C_2H_5)_2S$, $SeH_2$, $SeF_6$, $(CH_3)_2Se$, $(C_2H_5)_2Se$, $the_2$, $TeF_6$, $(CH_3)_2Te$, $(C_2H_5)_2Te$, etc.

Upon introducing any of these gaseous or gasifiable starting materials capable of supplying the atoms(M) into the deposition chamber, it is possible to dilute the starting material in a gas state with a dilution gas such as $H_2$, He, Ar or He.

In the case of structurally introducing the foregoing atoms(C,N,O) into a Non-Si(H,X) film to be formed in order to form the photoconductive layer, a gaseous starting material capable of supplying carbon atoms(C), nitrogen atoms(N) or oxygen atoms is introduced together with the foregoing gaseous starting materials upon forming said film.

Usable as the starting material capable of supplying carbon atoms(C) are, for example, gaseous or gasifiable saturated hydrocarbons of 1 to 4 carbon atoms, ethylenic hydrocarbons of 2 to 4 carbon atoms and acetylenic hydrocarbons of 2 to 3 carbon atoms.

Specifically, the saturated hydrocarbons can include methane ($CH_4$), ethane ($C_2H_6$), propane ($C_3H_8$), n-butane (n-$C_4H_{10}$) and pentane ($C_5H_{12}$), the ethylenic hydrocarbons can include ethylene ($C_2H_4$), propylene ($C_3H_6$), butene-1 ($C_4H_8$), butene-2 ($C_4H_8$), isobutylene ($C_4H_8$) and pentene ($C_5H_{10}$), and the acetylenic hydrocarbons can include acetylene ($C_2H_2$), methylacetylene ($C_3H_4$) and butine ($C_4H_6$)

Other than these compounds, carbon halides such as $CF_4$, $CCl_4$, $CH_3CF_3$, etc. can be used as the starting material capable of supplying carbon atoms(C). These carbon halides are advantageous since they can supply not only carbon(C) atoms but also halogen atoms(X).

As the starting material capable of supplying nitrogen atoms(N), there can be mentioned nitrogen gas($N_2$), gaseous or gasifiable nitrides and nitrogen compounds such as azide compounds comprising N as the constituent atoms or N and H as the constituent atoms, for example, ammonia ($NH_3$), hydrazine ($H_2NNH_2$), hydrogen azide ($HN_3$) and ammonium azide ($NH_4N_3$) In addition, nitrogen halides such as nitrogen trifluoride ($F_3N$) and nitrogen tetrafluoride ($F_4N_2$) can also be mentioned in that they can also introduce halogen atoms (X) in addition to the introduction of nitrogen atoms (N).

Likewise, as the starting material capable of supplying oxygen atoms(O), there can be mentioned, for example, oxygen ($O_2$), ozone ($O_3$), nitrogen monoxide(NO), nitrogen dioxide ($NO_2$), dinitrogen oxide($N_2O$), dinitrogen trioxide($N_2O_3$), dinitrogen tetraoxide($N_2O_4$), dinitrogen pentoxide($N_2O_5$), nitrogen trioxide($NO_3$), lower siloxanes comprising silicon atoms(Si), oxygen atoms(O) and hydrogen atoms(H) as the constituent atoms, for example, disiloxane($H_3SiOSiH_3$) and trisiloxane($H_3SiOSiH_2OSiH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, and $Ge_9H_{20}$ with $GeH_4$, $Ge_2H_6$, and $Ge_3H_8$, being preferable on account of their ease of handling and effective liberation of germanium atoms.

Other than these germanium compounds, there can be also mentioned gaseous or gasifiable germanium hydride halides such as $GeHF_3$, $GeH_2F_2$, $GeH_3F$, $GeHCl_3$, $GeHI_3$, $GeH_2I_2$, and $GeH_3I$; and gaseous or gasifiable germanium halides such as $GeCl_4$, $GeBr_4$, $GeI_4$, $GeF_2$, $GeCl_2$, $GeBr_2$, and $GeI_2$.

Likewise, as the starting material capable of supplying tin atoms(Sn), there can be mentioned, for example, gaseous or gasifiable tin hydrides such as $SnH_4$, $Sn_2H_6$, $Sn_3H_8$ and $Sn_4H_{10}$, with $SnH_4$, $Sn_2H_6$ and $Sn_3H_8$ being preferable on account of their ease of handling and effective liberation of tin atoms(Sn).

Other than these tin compounds, there can be also mentioned gaseous or gasifiable tin hydride halides such as $SnHF_3$, $SnH_2F_2$, $SnH_3F$, $snHCl_3$, $SnH_2Cl_2$, $SnH_3Cl$, $SnHBr_3$, $SnH_2Br_2$, $SnH_3Br$, $SnHI_3$, $SnH_2I_2$ and $SnH_3I$; and gaseous or gasifiable tin halides such as $SnF_4$, $SnCl_4$, $SnBr_4$, $SnI_4$, $SnF_2$, $SnCl_2$, $SnBr_2$ and $SnI_2$.

In the case of structurally introducing the foregoing atoms(A,T) into a Non-Si(H,X) film to be formed in order to form the photoconductive layer, a gaseous starting material capable of supplying atoms of the foregoing alkali metal, alkaline earth metal or transition element is introduced together with the foregoing starting materials upon forming said film.

Specifically, the starting material that can be used to supply sodium atoms(Na) includes sodium amine(-$NaNH_2$) and organometallic compounds containing sodium atoms (Na). Among them, sodium amine(-$NaNH_2$) is preferable from the standpoint of easy handling at the time of layer forming and the efficient supply of sodium atoms(Na).

The starting material that can be used to supply magnesium atoms(Mg) includes organometallic compounds containing magnesium atoms(Mg). Bis(cyclopentadienyl) magnesium (II) complex salt($Mg(C_5H_5)_2$) is preferable from the standpoint of easy handling at the time of layer forming and the efficient supply of magnesium atoms(Mg).

The starting material that can be used to supply yttrium atoms(Y) includes organometallic compounds containing yttrium atoms(Y). Triisopropanol yttrium $Y(Oi-C_3H_7)_3$ is preferable from the standpoint of easy handling at the time of layer forming and the efficient supply of yttrium atoms(Y).

The starting material that can be used to supply manganese atoms(Mn) includes organometallic compounds containing manganese atoms(Mn). Monomethylpentacarbonylmanganese $Mn(CH_3)(CO)_5$ is preferable from the standpoint of easy handling at the time of layer forming and the efficient supply of manganese atoms(Mn).

The starting material that can be used to supply zinc atoms(Zn) includes organometallic compounds containing zinc atoms(Zn) Diethyl zinc $ZnC_2H_5)_2$ is preferable from the standpoint of easy handling at the time of layer forming and the efficient supply of zinc atoms(Zn).

The starting material that can be used to supply copper atoms(Cu) includes organometallic compounds containing copper atoms(Cu). Copper (II) bisdimethylglyoximate $Cu(C_4H_7N_2O_2)_2$ is preferable from the standpoint of easy handling at the time of layer forming and the efficient supply of copper atoms(Cu).

The starting material that can be used to supply chromium atoms(Cr) includes compounds containing chromium atoms(Cr). $CrBr_3$, $Cr(CO)_6$, $Cr(C_5H_5)_2$ and $Cr(C_6H_6)_2$ are preferable from the standpoint of easy handling at the time of layer forming and the efficient supply of chromium atoms(Cr).

The starting material that can be used to supply ferrous atoms(Fe) includes organometallic compounds containing ferrous atoms(Fe). $FeBr_4$ and $Fe(C_2H_5)_2$ are preferable from the standpoint of easy handling at the time of layer forming and the efficient supply of ferrous atoms(Fe).

The starting material that can be used to supply nickel atoms(Ni) includes organometallic compounds containing nickel atoms(Ni). $Ni(CO)_4$ and $Ni(C_5H_5)_2$ are preferable from the standpoint of easy handling at the time of layer forming and the efficient supply of nickel atoms(Ni).

The formation of the photoconductive layer by the HR-CVD method can be performed in accordance with the HR-CVD film-forming process disclosed in U.S. Pat. No. 4,835,005.

The formation of the photoconductive layer by the FO-CVD method can be performed in accordance with the FO-CVD film-forming process disclosed in U.S. Pat. No. 4,818,564.

Surface Layer (104)

The surface layer is disposed on the foregoing photoconductive layer 103 and it is formed of a specific polysilane compound in which all the substitutional groups and end groups are substituted by specific oxygen-free organic group.

Specifically, said polysilane compound is one that has a weight average molecular weight in the range of from 6000 to 200000 and that is represented by the following formula (I).

[Wherein, $R_1$ stands for an alkyl group of 1 to 2 carbon atoms; $R_2$ stands for an alkyl group, cycloalkyl group, aryl group or aralkyl group of 3 to 8 carbon atoms; $R_3$ stands for an alkyl group of 1 to 4 carbon atoms; $R_4$ stands for an alkyl group of 1 to 4 carbon atoms; A and A' respectively stands for an alkyl group, cycloalkyl group, aryl group or aralkyl group of 4 to 12 carbon atoms wherein the two substituents may be the same or different one from the other; and each of n and m is a mole ratio showing the proportion of the number of respective monomers versus the total of the monomers in the polymer wherein $n+m=1$, $0<n\leq 1$ and $0\leq m<1$.]

Specifically, each of the foregoing substituent end groups A and A' is an organic group selected from the group consisting of alkyl groups such as methyl group, ethyl group and isopropyl group; cycloalkyl groups such as cyclopentyl group and cyclohexyl group; aryl groups such as phenyl group, tolyl group, xylyl group, diphenyl group, dimethylaminophenyl group and methoxyphenyl group; and aralkyl groups such as benzyl group and phenetyl group.

Likewise, each of the foregoing substituent groups $R_1$, $R_2$, $R_3$ and $R_4$ is an organic group selected from the group consisting of alkyl groups such as methyl group, ethyl group and isopropyl group; cycloalkyl groups such as cyclopentyl group and cyclohexyl group; aryl groups such as phenyl group, tolyl group, xylyl group, diphenyl group, dimethylaminophenyl group and methoxyphenyl group; and aralkyl groups such as benzyl group and phenethyl group.

In the electrophotographic light receiving member, the surface layer is constituted by the foregoing specific polysilane compound in which all the terminals being closed by the substituent organic group selected from the aforementioned alkyl, cycloalkyl, aryl and aralkyl groups.

Because of this, there are provided remarkable advantages that the injection efficiency of photocarrier between the surface layer and the photoconductive layer is always maintained in a desirable state, the surface layer slightly absorbs moisture, the quantity of moisture absorbed to the surface layer is not varied even upon changes in the relative humidity, the characteristics of the surface such as surface resistivity and volume resistivity are stably maintained, and the mobility of photocarrier in the surface is improved. In addition to these advantages, the electrophotographic light receiving member according to the present invention excels in the durability against the cleaning means such as a cleaning blade of the electrophotographic copying machine. Thus, the electrophotographic light receiving member according to the present invention stably and uniformly exhibits desirable electrophotographic characteristics required for image-formation even upon changes in use-environmental conditions even upon repeating use for a long period of time to stably and repeatedly provide high quality reproduced images.

As above described, the polysilane compound to be used for the formation of the surface layer in the present invention is represented by the foregoing formula (I) and has a weight average molecular weight in the range of from 6000 to 200000. In a preferred embodiment in the viewpoints of desirable solubility in solvents and desirable film-forming ability, the polysilane compound is of a weight average molecular weight preferably in the range of from 8000 to 120000, more preferably in the range of from 10000 to 80000.

Polysilane compounds of less than 6000 in weight average molecular weight do not exhibit polymer characteristics and do not have a film-forming ability. On the other hand, polysilane compounds exceeding 200000 in weight average molecular weight are poor with respect to solubility in solvents, and it is difficult to form films therefrom.

The polysilane compound to be used in the present invention possesses neither chlorine-containing group nor side reaction—causing group in which all the Si radicals being substituted by specific organic groups not containing any oxygen atom. The polysilane compound is innoxious, easily soluble in aromatic solvents such as toluene, benzene, xylene, etc., halogenated solvents such as dichloromethane, dichloroethane, chloroform, carbon tetrachloride, etc., and other solvents such as tetrahydrofuran (THF), dioxane, etc., and has an excellent film-forming ability.

The film formed of the polysilane compound is homogenous, uniform in thickness, has an excellent heat-resistance and excels in hardness and toughness.

The foregoing polysilane compound can be synthesized in the following manner. That is, under high purity inactive atmosphere containing neither oxygen nor water, dichlorosilane monomer in a solvent is contacted with a condensation catalyst comprising an alkaline metal to conduct dehalogenation and condensation polymerization, to thereby synthesize an intermediate polymer. The intermediate polymer thus obtained is separated from unreacted monomer and is reacted with a selected halogenating organic reagent in the presence of a condensation catalyst comprising an alkaline metal to condense an organic group to the terminals of the intermediate polymer, thereby obtaining the polysilane compound.

In the above synthesizing process, as any of the foregoing dichlorosilane monomer, intermediate polymer, halogenating organic reagent and alkaline metal condensation catalyst is highly reactive with oxygen and water, the foregoing polysilane compound cannot be obtained under such atmosphere wherein oxygen and/or water are present.

Therefore, the foregoing procedures of obtaining the polysilane compound to be used in the present invention is necessary to be carried out under the atmosphere containing neither oxygen nor water. Thus, due regards are to be made such that all the reagents to be used and the reaction vessel to be used contain neither oxygen nor water and the reaction system is not incorporated with oxygen or/and water during the synthesizing process. Specifically, with respect to the reaction vessel to be used, it is subjected to vacuum suction and argon gas substitution in a blow box, whereby eliminating adsorption of water or/and oxygen in the inside of said vessel.

As for the argon gas used in any case, it is necessary that argon gas is dehydrated by passing it through a silica gel column, oxygen is then removed therefrom by passing the dehydrated through a column charged with copper power which is maintained at 100° C. and the argon gas thus treated is used. Likewise, as for the dichlorosilane monomer, prior to its introduction into the reaction system, oxygen is removed therefrom by subjecting it to vacuum distillation with the use of said treated argon gas free of oxygen, and thereafter it is introduced into the reaction system.

The halogenating organic reagent to be used and the solvent to be used are also treated to be free of oxygen in the same manner as in the above case of treating the dichlorosilane monomer and they are introduced into the reaction system. As for the solvent, it is desired to be treated such that after being subjected to vacuum distillation with the use of the foregoing argon gas, the solvent is further treated with a metallic sodium to be completely free of water.

As the foregoing condensation catalyst, a wire-like shaped alkaline metal or chipped alkaline metals are used. In order to obtain said wired alkaline metal or chipped alkaline metals, the starting alkaline metal is wired or chipped in a paraffinic solvent free of oxygen and the resultant is used while having due regard not to case oxidation thereof.

As the starting dichlorosilane monomer to be used for producing the polysilane compound of the foregoing formula (I) in the present invention, there is selectively used a silane compound represented by the formula: $R_1R_2SiCl_2$ which will be later detailed or in addition, also selectively used a silane compound represented by the formula: $R_3R_4SiCl_2$ which will be later detailed.

As the foregoing condensation catalyst, it is desired to use an alkaline metal capable of causing dehalogenation and providing condensation reaction. Specific examples of such alkaline metal are lithium, sodium and potassium, among these, lithium and sodium being the most preferred.

The foregoing halogenating organic reagent is used for the introduction of a substituent represented by the A and a substituent represented by the A'. As such halogenating organic reagent, there is used a relevant compound selected from the group consisting of halogenated-alkyl compounds, halogenated-cycloalkyl compounds, halogenated-aryl compounds and halogenated-aralkyl compounds, that is, a relevant compound selected from the compounds represented by the general formula: A-X and/or a compound selected from the compounds represented by the general formula: A'-X (wherein X is Cl or Br) which will be later exampled.

As for the foregoing dichlorosilane monomer represented by the general formula: $R_1R_2SiCl_2$ or the dichlorosilane monomer represented by the general formula: $R_3R_4SiCl_2$ which is additionally used, they are dissolved in predetermined solvents and introduced into the reaction system. As such solvent, it is desired to use nonpolar paraffinic hydrocarbon solvents. Specific examples of such nonpolar solvent are n-hexane, n-octane, n-nonane, n-dodecane, cyclohexane, cyclooctane, etc.

The intermediate polymer synthesized is insoluble in any of these solvents and thus, it can be effectively separated from the unreacted dichlorosilane monomer.

At the time of reacting the intermediate polymer separated from the unreacted dichlorosilane monomer with the halogenating organic reagent, they are dissolved in the same solvent and they are reacted. In this case, there is desirably used an aromatic solvent such as benzene, toluene, xylene, etc. as said solvent.

In order to obtain a desired intermediate polymer by condensating the foregoing dichlorosilane monomer with the use of the foregoing alkaline metal catalyst, the polymerization degree of the resulting intermediate polymer can be controlled as desired by properly adjusting the reaction temperature and the reaction period of time. However, as for the reaction temperature, it is desired to be regulated in the range of from 60° C. to 130° C.

A preferred embodiment of the method for producing the foregoing polysilane compound represented by the formula (I) in the present invention is to be explained in the following.

That is, the method for producing said polysilane compound comprises the steps of: (i) producing the intermediate polymer and (ii) introducing the substituents A and A' to the terminals of said intermediate polymer.

The step (i) can be carried out as follows. That is, the inside of the reaction system of the reaction vessel is made substantially free of oxygen and water, charged with argon gas and the gas pressure thereof is maintained at a predetermined value. A paraffinic solvent free of oxygen and a condensation catalyst free of oxygen are introduced into the reaction system, and dichlorosilane monomer(s) free of oxygen is introduced thereinto. The reactants thus introduced into the reaction system were heated to a predetermined temperature while mixing them to cause condensation of said monomer. In this case, the condensation degree of said dichlorosilane monomer is controlled as desired by properly regulating the reaction temperature and the reaction period of time, to thereby obtain an intermediate polymer having a desired polymerization degree.

The reaction in this case is performed in the way as shown in the following reaction formula (i), wherein the chlorine radicals of the two dichlorosilane monomers and the condensation catalyst are reacted to cause dechlorination reaction wherein the Si radicals are repeatedly condensated and polymerized, whereby affording an intermediate polymer.

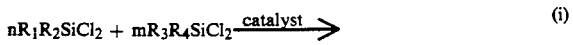

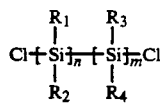

The reaction procedures in the above are made such that the condensation catalyst (alkaline metal) is firstly placed in the paraffinic solvent, into which the dichlorosilane monomers are dropwise introduced while stirring the reaction mixture and maintaining it at an elevated temperature. The polymerization degree of the resultant is confirmed by sampling the reaction liquid. The confirmation of the polymerization can be simply conducted by observing the state of the sampled reaction liquid if a film can be formed or not therefrom. When condensation proceeds to form a polymer, said polymer becomes precipitated in the form of white solid in the reaction liquid. When such white solid is precipitated as desired, the reaction liquid containing the white solid is cooled and decanted to separate the precipitate from the solvent. Thus, there is afforded an intermediate polymer. Then, the foregoing step (ii) is carried out. That is, the intermediate polymer thus obtained is subjected to dechlorination condensation with the use of the use of the halogenating organic reagent and the condensation catalyst (alkaline metal) to thereby substitute the end groups of said intermediate polymer by predetermined organic groups. The reaction in this case is performed in the way as shown in the following reaction formula (ii).

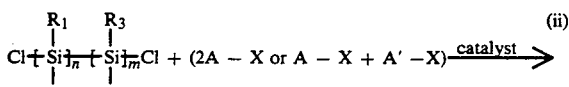

Specifically in this respect, the intermediate polymer obtained by condensation of the dichlorosilane monomers is dissolved in the aromatic solvent. Then, the foregoing condensation catalyst (alkaline metal) is added to the solution, and the foregoing halogenating organic reagent is dropwise added at room temperature. The halogenating organic reagent is added in an excessive amount of 0.01 to 0.1 moles over the amount of the starting monomer. The reaction mixture is gradually heated, and it is stirred for an hour while maintaining at a temperature of 80° C. to 100° C. to thereby perform the reaction as desired.

After the reaction being completed, methanol is added in order to remove the alkaline metal as the catalyst. Then, the polysilane compound resulted is extracted with toluene and purified by the use of a silica gel column. Thus, there is obtained an objective polysilane compound according to the present invention.

In a representative embodiment, the surface layer is formed of the foregoing specific polysilane compound which has a weight average molecular weight in the range of from 6000 to 200000 and which is represented by the foregoing formula (I).

The surface layer composed of said polysilane compound may contain an acceptor impurity or a donor impurity. In this case, there are provided advantages that the mobility of photocarrier in the surface layer is further improved and the injection efficiency of photocarrier between the surface layer and the photoconductive layer is further improved.

As the acceptor impurity, there can be mentioned, for example, halogen compound represented by the general formula: MXa, where M is an element belonging to the group VA of the periodic table, X is a halogen atom, and "a" is an integer decided by the valence of the M. Specific examples of the M are N, P, As and Sb. Specific example of the X are F, Cl, Br and I. Specific examples of the halogen compound represented by the general formula MXa are $NF_3$, $NF_5$, $NCl_3$, $NCl_5$, $NBr_3$, $NBr_5$, $NI_3$, $PF_3$, $PF_5$, $PCl_3$, $PCl_5$, $PBr_3$, $PBr_5$, $PI_3$, $AsF_3$, $AsF_5$, $AsCl_3$, $AsBr_3$, $AsI_3$, $SbF_3$, $SbF_5$, $SbCl_3$, $SbCl_5$, $SbBr_3$ and $SbI_3$.

As the donor impurity, there can be mentioned, for example, amine compounds. Specific examples of such amine compound are aliphatic primary amines represented by the general formula: $C_mH_{2m+1}NH_2$, aliphatic secondary amines by the general formula: $(C_mH_{2m+1})_2NH$, aliphatic tertiary amines represented by the general formula: $(C_mH_{2m+1})_3N$ (wherein "m" is an integer of more than 1), aliphatic unsaturated amines such as allyl amine, diallyl amine, triallyl amine, etc., cyclic amines such as cyclopropyl amine, cyclobutyl amine, cyclopentyl amine, cyclohexyl amine, etc., and aromatic amines such as aniline, methylaniline, dimethylaniline, ethylaniline, diethylaniline, o-toluidine, m-toluidine, p-toluidine, benzylamine, dibenzylamine, tribenzylamine, diphenylamine, triphenylamine, α-naphtylamine, o-phenylenediamine, m-phenylenediamine, p-phenylenediamine, tetramethyl-p-phenylenediamine, etc.

In the case where the surface layer contains the foregoing acceptor impurity or donor impurity, the amount of such impurity to be incorporated into the surface layer is preferably in the range of from $1\times10^{-4}$ to 10 parts by weight, more preferably in the range of from $5\times10^{-4}$ to 5 parts by weight, most preferably in the range of from $1\times10^{-3}$ to 1 part by weight, respectively versus 100 parts by weight of the polysilane compound constituting the surface layer.

In order to form the surface layer composed of the foregoing polysilane compound, the foregoing polysilane compound is dissolved in an appropriate solvent in an amount of, preferably, 0.1 to 5 wt. % versus the solvent, to thereby obtain a coating liquid. A predetermined amount of the coating liquid is applied on the surface of the photoconductive layer previously formed on a substrate to form a liquid coat thereon by a known coating method such as a dip coating method, a spray coating method or a wire bar coating method, followed by air-drying or heat-drying under the condition of not damaging the photoconductive layer.

As said solvent, there can be mentioned, for example, aromatic solvents such as benzene, toluene, xylene, etc., halogenic solvents such as dichloromethane, dichloroethane, chloroform, etc., other than these tetrahydrofuran, dioxane, etc.

In the case of incorporating the foregoing acceptor impurity or donor impurity into the surface layer, a selected compound as the acceptor impurity or donor acceptor is dispersed into the above coating liquid prior to applying the coating liquid onto the surface of the photoconductive layer.

In an alternative, a selected compound as the acceptor impurity or donor impurity is gasified with the use of an inert gas to form a gas atmosphere of a predetermined pressure in a substantially enclosed chamber, wherein the foregoing air-dried layer composed of the polysilane compound as the surface layer formed on the photoconductive layer is exposed to said gas atmosphere to thereby penetrate the acceptor impurity or donor acceptor into said air-dried layer.

The thickness of the surface layer to be thus formed on the photoconductive layer in the electrophotographic light receiving member of the present invention should be determined depending upon the kind of the photoconductive layer on which the surface layer is to be disposed and other related factors while having due regard to attain the object of the present invention.

However, in general, it is preferably in the range of from 0.003 to 5 μm, more preferably in the range of from 0.01 to 1 μm or most preferably in the range of from 0.05 to 0.5 μm.

SPECIFIC EXAMPLES OF THE $R_1R_2 SiCl_2$ AND $R_3R_4 SiCl_2$

Note: Among the following compounds, compounds of a-2 to a-16, a-18, a-20, a-21, a-23 and a-24 are used as the $R_1R_2 SiCl_2$, and compounds of a-1, a-2, a-11, a-17, a-19, a-22, a-23 and a-25 as the $R_3R_4 SiCl_2$.

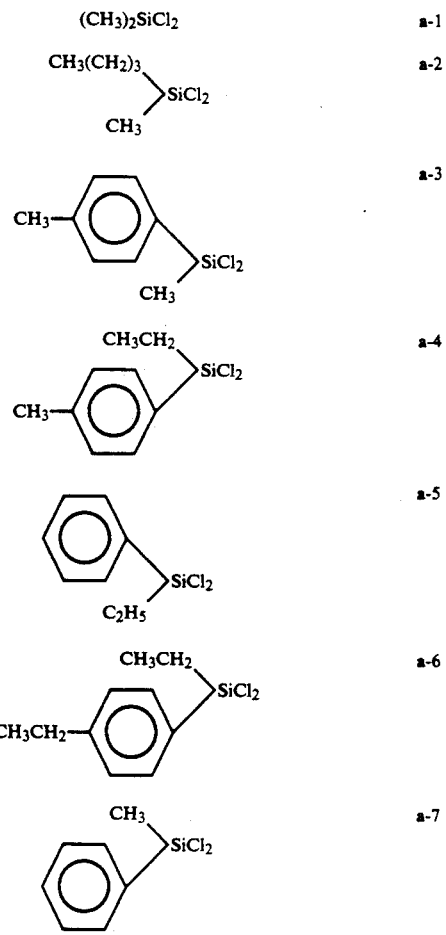

-continued

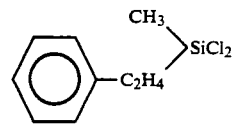 a-8

CH₃(CH₂)₆\\SiCl₂/CH₃  a-9

CH₃(CH₂)₇\\SiCl₂/CH₃  a-10

(CH₃)₂CH\\SiCl₂/CH₃  a-11

CH₃(CH₂)₁₁\\SiCl₂/CH₃  a-12

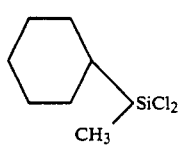 a-13

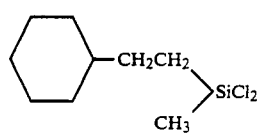 a-14

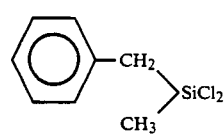 a-15

CH₃(CH₂)₅\\SiCl₂/CH₃  a-16

C₂H₅\\SiCl₂/CH₃  a-17

(CH₃)₃C CH₂\\SiCl₂/CH₃  a-18

CH₃(CH₂)₃\\SiCl₂/CH₃(CH₂)₃  a-19

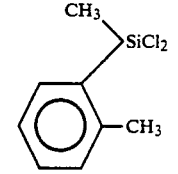 a-20

-continued

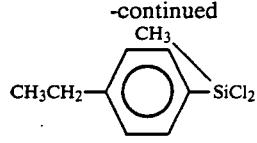 a-21

((CH₃)₂CH)₂SiCl₂  a-22

CH₃CH₂\\SiCl₂/(CH₃)₂CH  a-23

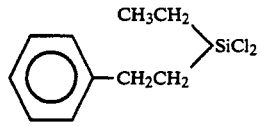 a-24

((CH₃)₃C)₂SiCl₂  a-25

SPECIFIC EXAMPLES OF THE A-X AND THE A'-X (CH₃)₂CHCH₂Cl  b-1

CH₃(CH₂)₄Cl  b-2

CH₃(CH₂)₅Cl  b-3

CH₃(CH₂)₁₀Cl  b-4

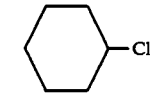 b-5

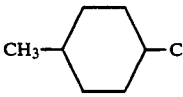 b-6

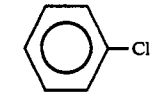 b-7

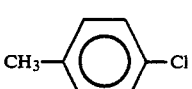 b-8

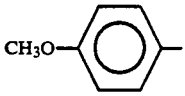 b-9

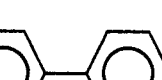 b-10

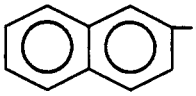 b-11

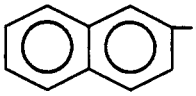 b-12

-continued
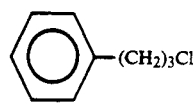 b-13
CH₃(CH₂)₅Br  b-14
CH₃(CH₂)₁₀Br  b-15
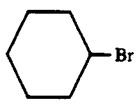 b-16
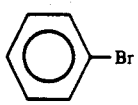 b-17
SPECIFIC EXAMPLES OF THE POLYSILANE COMPOUND TO BE USED IN THE PRESENT INVENTION
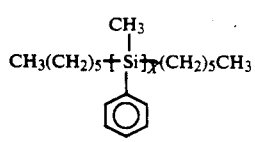 c-1
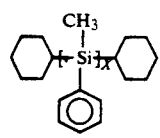 c-2
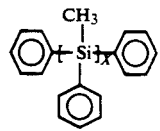 c-3
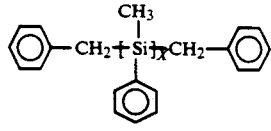 c-4
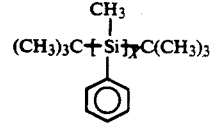 c-5
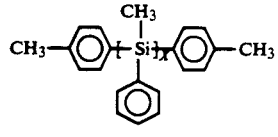 c-6
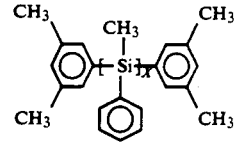 c-7
-continued
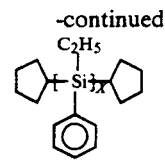 c-8
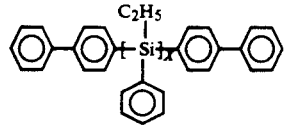 c-9
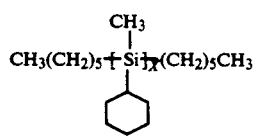 c-10
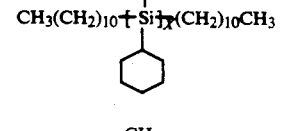 c-11
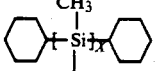 c-12
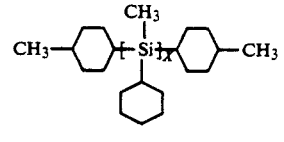 c-13
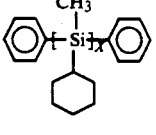 c-14
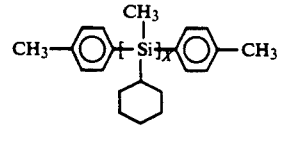 c-15
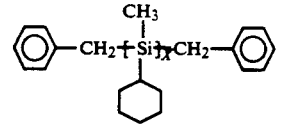 c-16
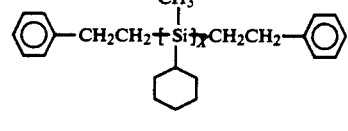 c-17
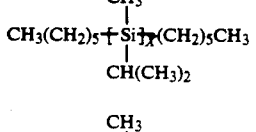 c-18
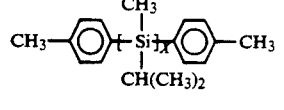 c-19

-continued
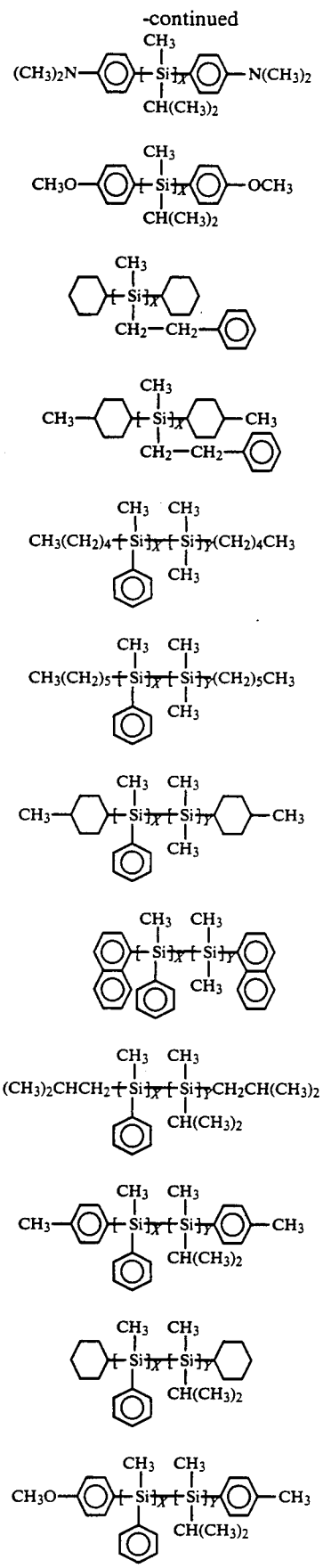
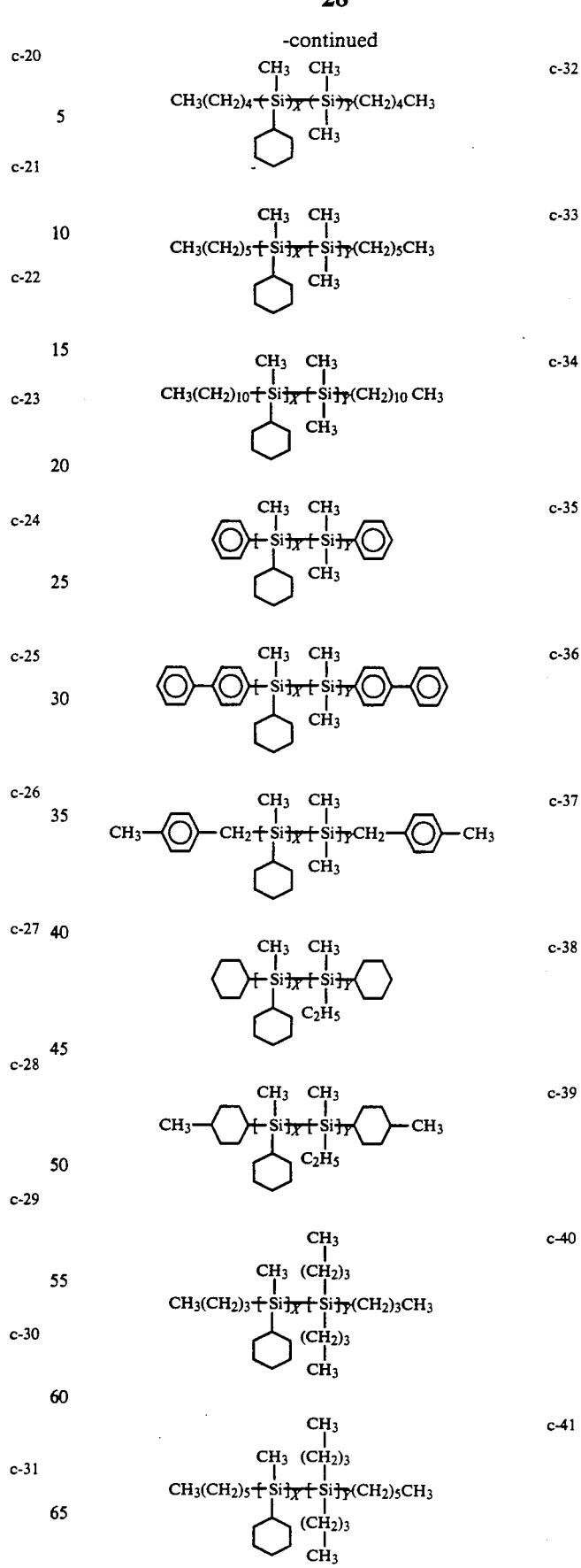

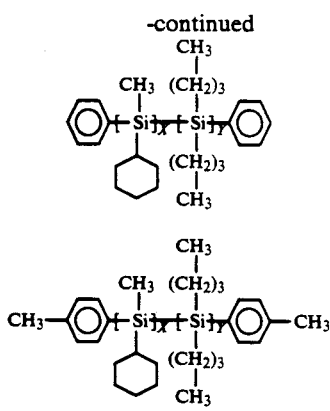

Note: X and Y in the above structural formulas respectively stands for a polymeric unit of the monomer. n is obtained by the calculation equation: X/(X+Y), and m is obtained by the calculation equation: Y/(X+Y).

Lower Layer

The lower layer is disposed between the substrate 101 and the photoconductive layer 103 and it is formed of the foregoing specific polysilane compound to be used for the formation of the surface layer. Particularly, the lower layer is constituted by the foregoing polysilane compound which has a weight average molecular weight in the range of from 6000 to 200000 and which is represented by the foregoing formula (I).

For the electrophotographic light receiving member of the present invention which is provided with the lower layer composed of said specific polysilane compound being disposed between the substrate 101 and the photoconductive layer 103, there are advantages that the injection efficiency of photocarrier between the substrate and the photoconductive layer is further improved and influences due to the structural defects in the photoconductive layer are diminished, and as a result, further improved high quality images excelling in sharpness and without being accompanied with fogged images, dots, etc. can be stably and repeatedly provided.

The lower layer is formed on the surface of the substrate 101 prior to forming the photoconductive layer 103.

The lower layer can be formed in the same manner as in the case of forming surface layer.

Specifically, the foregoing polysilane compound is dissolved in an appropriate solvent to obtain a coating liquid, a predetermined amount of the coating liquid is applied on the surface of a substrate 101 to form a liquid coat thereon by a known coating method such as a dip coating method, a spray coating method or a wire bar coating method, followed by air-drying or heat-drying.

The thickness of the surface layer to be thus formed on the photoconductive layer in the electrophotographic light receiving member of the present invention should be determined depending upon the kind of the photoconductive layer to be formed thereon and other related factors while having due regards to attain the object of the present invention.

However, in general, it is preferably in the range of from 0.003 to 5 μm, more preferably in the range of from 0.01 to 1 μm or most preferably in the range of from 0.05 to 0.5 μm.

EXAMPLES OF SYNTHESIS

In the following, examples of obtaining the foregoing polysilane compounds represented by the formula (I) to be used for the formation of the surface layer of the electrophotographic light receiving member according to the present invention will be described.

EXAMPLE OF SYNTHESIS 1

In this example, there was synthesized a polysilane compound which is represented by the following formula.

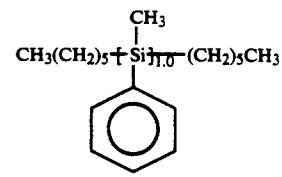

A three-necked flask was placed in a blow box which was vacuum-aspirated and charged with argon gas, and a reflux condenser, temperature gage and dropping funnel were provided to the device. And argon gas was passed through a by-pass pipe of the dropping funnel.

100 g of dehydrated dodecane and 0.3 moles of wire-like shaped metallic sodium were introduced into the three-necked flask and heated to 100° C. while stirring. Then, a solution prepared by dissolving 0.1 moles of dichlorosilane monomer having the under-mentioned formula (product by Chisso Kabushiki Kaisha) in 30 g of dehydrated dodecane was dropwise added to the reaction system.

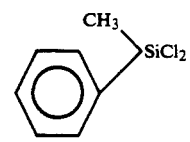

After its addition being completed, the reactants were subjected to condensation polymerization at 100° C. for an hour to precipitate white solids. Thereafter the resultant was cooled and the dodecane was decanted. 100 g of dehydrated toluene was added to dissolve the white solids, to which 0.01 moles of metallic sodium was added. Then, a solution prepared by dissolving 0.01 moles of n-hexylchloride $(CH_3(CH_2)_5Cl)$ (product by Tokyokasei Kabushiki Kaisha) in 10 ml of toluene was dropwise and slowly added to the reaction system while stirring, followed by heating at 100° C. for an hour. After cooling, 50 ml of methanol was dropwise and slowly added to treat excessive metallic sodium. As a result, there were formed a suspended phase and a toluene phase. The toluene phase was separated, subjected to vacuum concentration, and purified by a chromatography using a silica gel column to obtain a polysilane compound of the foregoing formula with a yield of 62%.

As for the polysilane compound thus obtained, its weight average molecular weight was measured by subjecting the specimen to THF development in accordance with the known GPC method. It was 77,000 (wherein polystyrene was made to be the reference standard.).

Further, a KBr pellet of the foregoing product was prepared and it was set to a Nicolet FT-IR 750 (product by Nicolet Japan Co., Ltd.) to thereby measure its FT-IR spectrum. As a result, there were found an absorption peak near 1250 cm$^{-1}$ and another absorption peak near 800 cm$^{-1}$ belonging to Si-methyl group bond; an absorption peak near 1430 cm$^{-1}$ and another absorption peak near 1100 cm$^{-1}$ belonging to Si-phenyl group bond; an absorption peak near 2900 cm$^{-1}$ and another absorption peak near 1470 cm$^{-1}$ belonging to methyl group; and an absorption peak near 1450 cm$^{-1}$ and another absorption peak belonging to methylene group.

There were found neither an absorption peak belonging to unreacted Si-Cl bond nor an absorption peak belonging to Si-O-Si bond or Si-O-R bond of a by-product.

Further in addition, a specimen of the foregoing product was dissolved in CDCl$_2$ and set to a FT-NMR FX-POQ (product by JEOL, Ltd.) to measure its FT-NMR. As a result, there were found an absorption peak near 0.60 ppm belonging to Si-methyl group bond; an absorption peak near 7.21 ppm belonging to Si-phenyl group bond; an absorption peak near 1.10 ppm belonging to methyl group or Si-methyl bond; and an absorption peak near 1.61 ppm belonging $+CH_2+$ to group.

EXAMPLE OF SYNTHESIS 2

In this example, there was synthesized a polysilane compound which is represented by the following formula.

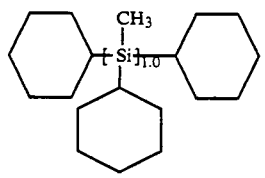

A three-necked flask was placed in a blow box which was vacuum-aspirated and charged with argon gas, and a reflux condenser, temperature gage and dropping funnel were provided to the device. Argon gas was passed through the by-pass pipe of the dropping funnel.

100 g of dehydrated dodecane and 0.3 moles of metallic lithium of 1 mm in size were introduced into the three-necked flask and heated to 80° C. while stirring. Then, a solution prepared by dissolving 0.1 moles of dichlorosilane monomer having the under-mentioned formula (product by Chisso Kabushiki Kaisha) in 30 g of dehydrated dodecane was dropwise and slowly added to the reaction system.

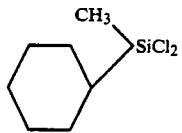

After its addition being completed, the reactants were subjected to condensation polymerization at 80° C. for an hour to precipitate white solids. The resultant was cooled and the dodecane was decanted. 100 g of dehydrated toluene was added to dissolve the white solids, to which 0.01 moles of metallic sodium was added. Then, a solution prepared by dissolving 0.01 moles of cyclohexyl chloride (product by Tokyo Kasei Kabushiki Kaisha) in 10 ml of toluene was dropwise and slowly added to the reaction system while stirring, followed by heating at 80° C. for an hour. After cooling, 50 ml of methanol was dropwise and slowly added to treat excessive metallic sodium. As a result, there were formed a suspended phase and a toluene phase. The toluene phase was separated, subjected to vacuum concentration, and purified by a chromatography using a silica gel column to obtain a polysilane compound of the foregoing formula. The yield was 72%. Its weight average molecular weight was 30,000.

The FT-IR spectrum of the product thus obtained was measured in the same manner as in Example of Synthesis. As a result, there were found an absorption peak near 1250 cm$^{-1}$ and another absorption peak near 800 cm$^{-1}$ belonging to Si-methyl group bond; and an absorption peak near 1450 cm$^{-1}$ and another absorption peak near 11250 cm$^{-1}$ belonging to Si-cyclohexyl group bond.

There were found neither an absorption peak belonging to unreacted Si—Cl bond nor an absorption peak belonging to Si—O—Si bond or Si—O—R bond.

In addition, the foregoing product was subjected to NMR measurement in the same manner as in Example of Synthesis 1.

As a result, there were found an absorption peak near 0.60 ppm belonging to Si-methyl group bond; an absorption peak near 1.58 ppm and another absorption peak near 2.04 ppm belonging to Si-cyclohexyl group bond; and an absorption peak near 7.21 ppm belonging to Si-phenyl group bond.

EXAMPLE OF SYNTHESIS 3

In this example, there was synthesized a polysilane compound which is represented by the following formula.

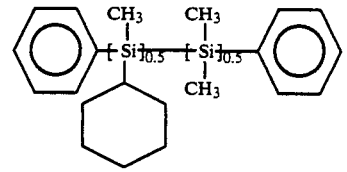

In order to synthesize the above polysilane compound, the procedures of Example of Synthesis 1 were repeated, except for using cycohexyl chloride as the terminal group treating agent and using the following two different dichlorosilane monomers (respectively product by Chisso Kabushiki Kaisha) respectively in an amount of 0.05 moles.

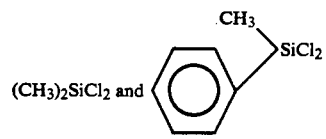

As a result, there was obtained a polysilane compound of the foregoing formula having a weight average molecular weight of 55,000 with a yield of 58%.

The FT-IR spectrum of the product thus obtained was measured in the same manner as in Example of Synthesis. As a result, there were found an absorption peak near 1250 cm$^{-1}$ and another absorption peak near 800 cm$^{-1}$ belonging to Si-methyl group bond; an absorption peak near 1450 cm$^{-1}$ and another absorption peak near 1150 cm$^{-1}$ belonging to Si-cyclohexyl group bond; and an absorption peak near 1430 cm$^{-1}$ and another absorption peak near 1100 cm$^{-1}$ belonging to Si-phenyl group bond.

There were found neither an absorption peak belonging to unreacted Si—Cl bond nor an absorption peak belonging to Si—O—Si bond or Si—O—R bond.

In addition, the foregoing product was subjected to NMR measurement in the same manner as in Example of synthesis 1.

As a result, there were found an absorption peak near 0.60 ppm belonging to Si-methyl group bond; an absorption peak near 1.58 ppm and another absorption peak near 2.04 ppm belonging to Si-cyclohexyl group bond; and an absorption peak near 7.21 ppm belonging to si-phenyl group bond.

EXAMPLE OF SYNTHESIS 4

In this example, there was synthesized a polysilane compound which is represented by the following formula.

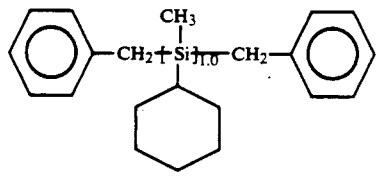

In order to synthesize the above polysilane compound, the procedures of Example of Synthesis 2 were repeated, except for using benzyl chloride (product by Kantoh Chemical Co., Ltd.) as the terminal group treating agent.

As a result, there was obtained a polysilane compound of the foregoing formula having a weight average molecular weight of 63,000 with a yield of 67%.

The FT-IUR spectrum of the product thus obtained was measured in the same manner as in Example of Synthesis. As a result, there were found an absorption peak near 1250 cm$^{-1}$ and another absorption peak near 800 cm$^{-1}$ belonging to Si-methyl group bond; an absorption peak near 1450 cm$^{-1}$ and another absorption peak near 1150 cm$^{-1}$ belonging to Si-cyclohexyl group bond; an absorption peak near 1450 cm$^{-1}$ belonging to Si-methylene group bond; and an absorption peak near 1600 cm$^{-1}$ belonging to benzyl group.

There were found neither an absorption peak belonging to unreacted Si—Cl bond nor an absorption peak belonging to Si—O—Si bond or Si—O—R bond.

In addition, the foregoing product was subjected to NMR measurement in the same manner as in Example of Synthesis 1.

As a result, there were found an absorption peak near 0.60 ppm belonging to Si-methyl group bond; an absorption peak near 1.58 ppm and another absorption peak near 2.04 ppm belonging to Si-cyclohexyl group bond; an absorption peak near 1.78 ppm belonging to Si-methylene bond; and an absorption peak near 7.25 ppm belonging to benzyl group.

DESCRIPTION OF THE PREFERRED EMBODIMENTS

The electrophotographic light receiving member of the present invention will be described in more detail with reference to the following examples, which are not intended to restrict the scope of the invention.

Figure 3:
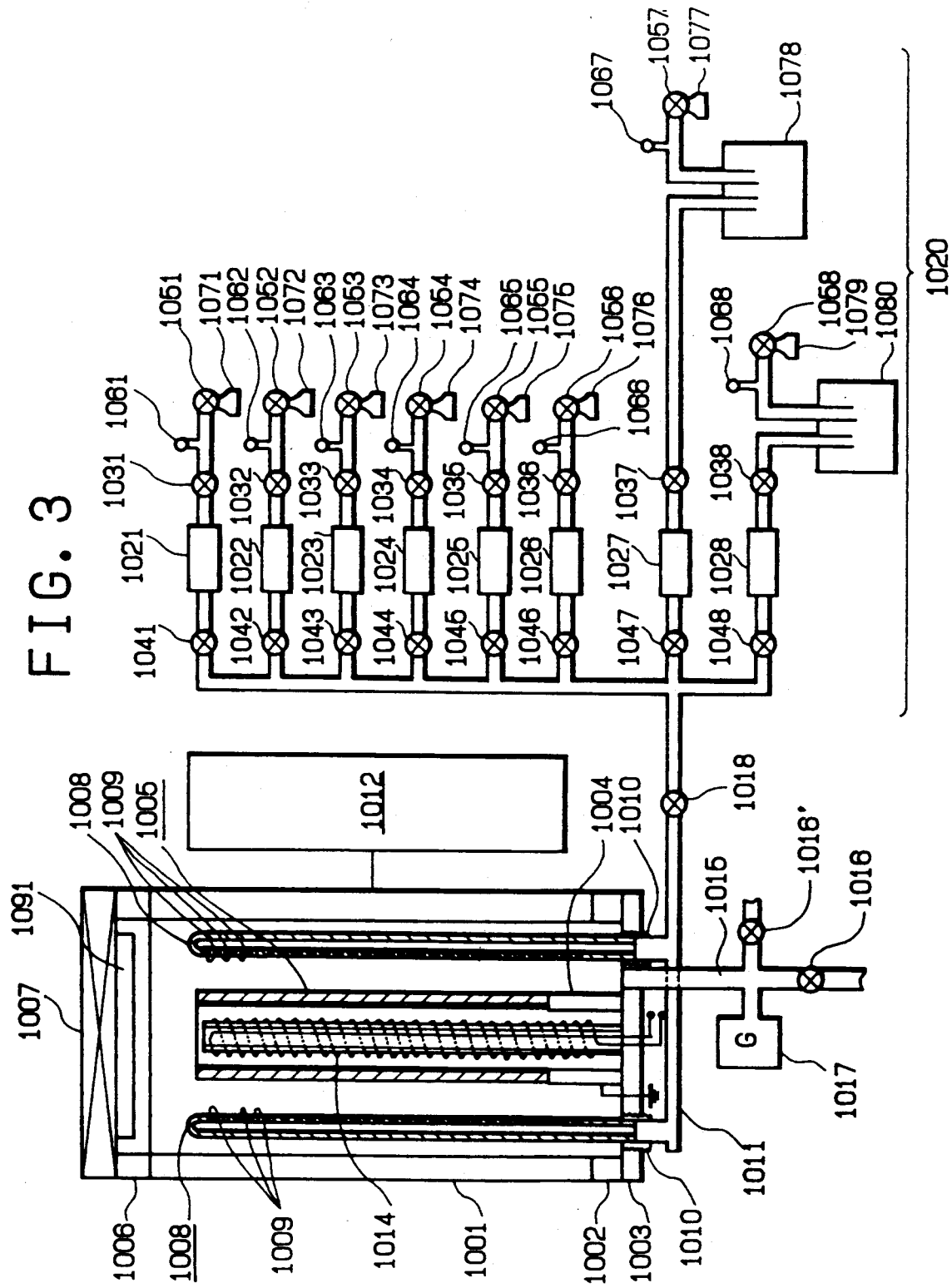
FIG. 3 is a schematic diagram of an apparatus suitable for forming a light receiving layer comprised of a non-single crystal material such as an amorphous material of the electrophotographic light receiving member by a RF glow discharge decomposition process.
Figure 5:
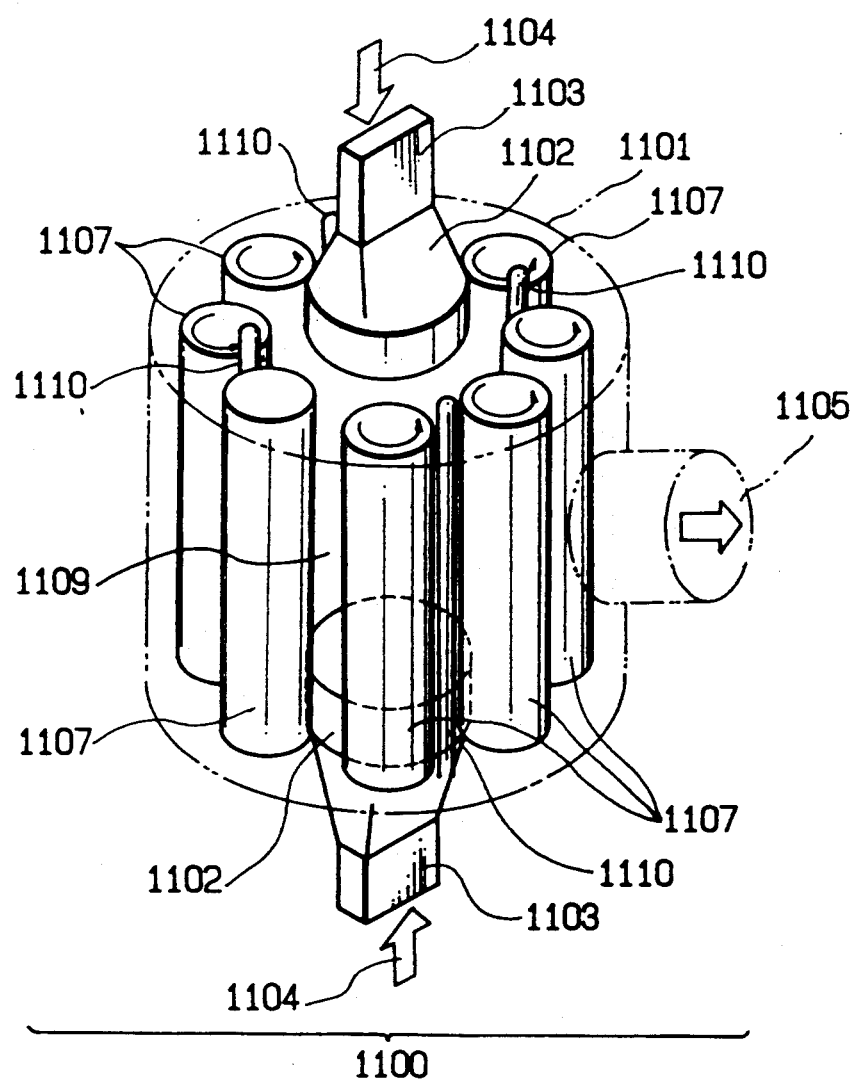
FIG. 5 is a schematic diagram of a film-forming chamber of a microwave plasma CVD apparatus suitable for forming a light receiving layer comprised of a non-single crystal material such as an amorphous material of the electrophotographic light receiving member on a plurality of substrates in the present invention.

In each of the examples, the photoconductive layer was formed by a RF (high frequency) glow discharging method using the apparatus shown in FIG. 3 or a microwave glow discharging method using the apparatus shown in FIG. 5.

EXAMPLE 1

There was prepared five electrophotographic light receiving member of the present invention. The photoconductive layer was formed by using the film-forming apparatus by the RF glow discharging method shown in FIG. 3.

Formation of the Photoconductive Layer

There was formed a photoconductive layer comprising a first layer region, a second layer region and a third layer region on a cylindrical aluminum substrate of 108 mm in outer diameter, 358 mm in length and 5 mm in thickness and having a mirror-ground surface under film-forming conditions shown in Table 2, using the apparatus shown in FIG. 3.

Referring to FIG. 3, gas reservoirs 1071, 1072, 1073, 1074, 1075, and 1076 are charged with film-forming raw material gases for forming the respective layer regions, that is, for instance, SiH$_4$ gas (99.999% purity) in the reservoir 1071, H$_2$ gas (99.9999% purity) in the reservoir 1072, CH$_4$ gas (99.999% purity) in the reservoir 1073, GeH$_4$ gas (99.999% purity) in the reservoir 1074, B$_2$H$_6$ gas (99.999% purity) diluted with H$_2$ gas (hereinafter referred to as "B$_2$H$_6$/H$_2$ gas") in the reservoir 1075, and NO gas (99.999% purity in the reservoir 1076.

Each of gas reservoirs 1077 and 1079 is charged with He gas (99.999%). Substantially enclosed vessel 1078 contains Al(CH$_3$)$_3$(99.99% purity) therein, and substantially enclosed vessel 1080 contains NaNH$_2$ (99.99% purity).

Numeral reference 1005 stands for the foregoing cylindrical aluminum substrate placed on a rotatable cylindrical substrate holder having an electric heater 1014 therein which is arranged in the reaction space of a deposition chamber 1001. In the reaction space of the deposition chamber 1001, there are installed a plurality of gas feed pipes 1008 respectively being provided with gas liberation holes 1009 spouting a film-forming raw material gas toward the aluminum substrate 1005. Said plurality of gas feed pipes 1008 are connected to gas supply pipe 1011 provided with a sub-value 1018, extending from a gas supply system 1020 including the foregoing gas reservoirs. The deposition chamber is provided with an exhaust pipe 1015 being connected through an exhaust valve 1016 to a vacuum pump (not shown). Numeral reference 1017 stands for a vacuum gage connected to the exhaust pipe 1015. The exhaust pipe 1015 is provided with a leak valve 1016'. Numeral reference 1012 stands for a RF matching box extending from a RF power source (not shown), being electrically connected to the deposition chamber 1001.

In the above apparatus, prior to the entrance of film-forming raw material gases into the reaction space, it is confirmed that valves 1051 through 1058 of the gas reservoirs 1071 through 1077 and 1079, inlet valves 1031 through 1038, and the leak valve 1016' are closed and that exit valves 1041 through 1048 and the sub-valve 1018 are opened. Then, the exhaust valve 1016 is opened and the vacuum pump (not shown) is actuated to evacuate the reaction space of the deposition chamber 1001 and the gas pipe ways. Upon observing that the reading on the vacuum gage 1017 became about $5 \times 10^{-6}$ Torr, the sub-valve 1018 and the outlet valves 1041 through 1048 are closed.

In the case of introducing film-forming raw material gases into the reaction space upon film formation, the apparatus is operated, for instance, in the following way.

SiH$_4$ gas from the reservoir 1071, H$_2$ gas from the reservoir 1072, CH$_4$ gas from the reservoir 1073, GeH$_4$ gas from the reservoir 1074, B$_2$H$_6$/H$_2$ gas from the reservoir 1075, NO gas from the reservoir 1076, and He gas from the reservoirs 1077 and 1079 are caused to flow into mass flow controllers 1021 through 1028 by opening the valves 1051 through 1058 and the inlet valves 1031 through 1038 while controlling each of the pressures of exit gages 1061 through 1068 to about 2 kg/cm$^2$. In this case, He gas from the reservoir 1077 is introduced into the vessel 1078 containing Al(CH$_3$)$_3$ to cause a gas comprising Al(CH$_3$)$_3$ gasified with He gas (hereinafter referred to as "Al(CH$_3$)$_3$/He gas"), which is followed by flowing into the mass flow controller 1029. Likewise, He gas from the reservoir 1079 is introduced into the vessel 1080 containing NaNH$_2$ to cause a gas comprising NaNH$_2$ gasified with He gas as (hereinafter referred to as "NaNH$_2$/He gas"), which is followed by flowing into the mass flow controller 1028. Subsequently, the exit valves 1041 through 1048, and the sub-valve 1018 are gradually opened to enter the gases into the reaction space through the gas feed pipes 1008. In this case, the exit valves 1041 through 1048 are adjusted so as to attain a desired value for the ratio among the flow rates of the gases, and the opening of the exhaust valve 1016 is adjusted while observing the reading on the vacuum gage 1017 so as to attain a desired value for the gas pressure of the reaction space. Then, after confirming that the temperature of the aluminum substrate 1005 being rotated by a driving motor (not shown) is maintained at a predetermined temperature (for example at about 250° C.) by the electric heater 1014, a predetermined RF power is applied through the matching box 1012 into the reaction space to cause glow discharge therein while controlling the flow rates of the gases in accordance with a previously designed variation coefficient curve by using a microcomputer (not shown).

Now, reference is made in the following to an example of forming the foregoing photoconductive layer The photoconductive layer was formed under the conditions shown in Table 2.

Firstly, the first layer region was formed on the foregoing cylindrical aluminum substrate in accordance with the manner as above explained. That is, the exit valves 1041, 1042, 1045 and 1046, and the sub-valve 1018 were gradually opened to introduce SiH$_4$ gas, H$_2$ gas, B$_2$H$_6$/H$_2$ gas and NO gas through the gas feed pipes 1008 into the reaction space of the deposition chamber 1001. In this case, the flow rate of the SiH$_4$ gas, the flow rate of the H$_2$ gas, the flow rate of the B$_2$H$_6$/H$_2$ gas and the flow rate of the NO gas were controlled to 100 SCCM, 500 SCCM, 1200 ppm (against the SiH$_4$ gas) and 5 SCCM respectively by adjusting the mass flow controllers 1021, 1022, 1025 and 1026.

The gas pressure (inner pressure) of the reaction space of the deposition chamber 1001 was controlled to 0.4 Torr by reguarating the opening of the exhaust valve 1016 while observing the reading on the vacuum gage 1017. The aluminum substrate was maintained at 250° C. Then, a RF power of 10 mW/cm$^3$ was applied into the reaction space of the deposition chamber 1001 through the RF matching box 1012 to cause glow discharge in the reaction space, whereby forming a 3 $\mu$m thick layer to be the first layer region on the cylindrical aluminum substrate.

After the formation of the first layer region being completed, the application of the RF power was suspended, and the exit valves 1041, 1042, 1045 and 1046, and the sub-valve 1018 were closed.

Then, a layer to be the second layer region was formed on the previously formed first layer region. Subsequent to the procedures as above described, the exit valves 1041, 1042 and 1045 and the sub-valve 1018 were opened to introduce SiH$_4$ gas, H$_2$ gas and B$_2$H$_6$/H$_2$ gas into the reaction space of the deposition chamber 1001 at respective flow rates of 600 SCCM, 600 SCCM and 0.6 ppm (against the SiH$_4$ gas) by adjusting the mass flow controllers 1021, 1022 and 1025. The gas pressure (inner pressure) of the reaction space of the deposition chamber 1001 was controlled to 0.6 Torr by regulating the opening of the exhaust valve 1016 while observing the reading on the vacuum gage 1017. The substrate having the first layer region thereon was maintained at 250° C. Then, a RF power of 10 mW/cm$^3$ was applied into the reaction space of the deposition chamber 1001 through the RF matching box 1012 to cause glow discharge in the reaction space, whereby forming a 25 $\mu$m thick layer to be the second layer region on the surface of the first layer region.

After the formation of the second layer region being completed, the application of the RF power was suspended, and the exit valves 1041, 1042 and 1045 and the sub-valve 1018 were closed.

Then, a layer to be the third layer region was formed on the previously formed second layer region. Subsequent to the procedures as above described, the exit valves 1041 and 1043 and the sub-valve 1018 were opened to introduce SiH$_4$ gas and CH$_4$ into the reaction space of the deposition chamber 1001 at respective flow rates of 50 SCCM and 500 SCCM by adjusting the mass flow controllers 1021 and 1023. The gas pressure (inner pressure) of the reaction space of the deposition chamber 1001 was controlled to 0.4 Torr by regulating the opening of the exhaust valve 1016 while observing the reading on the vacuum gage 1017. The substrate having the first and second layer regions thereon was maintained at 250° C. Then, a RF power of 10 mW/cm$^3$ was applied into the reaction space of the deposition chamber 1001 through the RF matching box 1012 to cause glow discharge in the reaction space, whereby forming a 0.5 $\mu$m thick layer to be the third layer region on the surface of the second layer region.

After the formation of the third layer region being completed, the application of the RF power was terminated, and the exit valves 1041 and 1043 and the sub-valve 1018 were closed.

The conditions for forming each of the first, second and third layer regions were collectively shown in Table 2.

In the above procedures of forming each of the first, second and third layer regions, all the exit valves other than those required for upon forming the respective layer regions were of course closed. Further, upon forming the respective layer regions, the inside of the system was once evacuated to a high vacuum degree as required by closing the exit valves 1041 through 1048 while opening the sub-valve 1018 and fully opening the exhaust valve 1016 for avoiding the gases having been used for the formation of the previous layer were left in the deposition chamber 1001 and in the pipe ways from the exit valves 1041 through 1048 to the inside of the deposition chamber 1001.

Further, during the layer forming operation, the cylindrical aluminum substrate 1005 was rotated at a predetermined speed by the driving motor (not shown).

Formation of the Surface Layer

The cylindrical aluminum substrate having the photoconductive layer formed thereon in the above was taken out from the deposition chamber, and a 0.2 μm thick surface layer was formed on the photoconductive layer with the use of the polysilane compound obtained in the foregoing Example of Synthesis 1 in the following way.

50 g of the polysilane compound was dissolved in 5 l of toluene to obtain a coating liquid.

The coating liquid was applied onto the surface of the photoconductive layer formed on the cylindrical aluminum substrate by a dip coating method in an amount to provide a 0.2 μm thickness when dried, followed by air-drying to thereby form a 0.2 μm thick layer to be the surface layer on the photoconductive layer.

Thus, there was obtained an electrophotographic light receiving member.

There were prepared further four electrophotographic light receiving member samples by repeating the above procedures.

There were prepared five electrophotographic light receiving member samples in total.

Each of these five electrophotographic light receiving member samples was evaluated with respect to environmental stability, uniformity of images reproduced and durability of a cleaning means (cleaning blade) in the following manner. The evaluated result with respect to each evaluation item was obtained by averaging the evaluated results obtained for the five electrophotographic light receiving member samples.

Each of the five electrophotographic light receiving member samples was set to a modification of a commercially available electrophotographic copying machine NP-7550 (product of CANON KABUSHIKI KAISHA) for use in evaluation purposes to conduct the evaluation of environmental stability, uniformity of images reproduced, and durability of the cleaning blade of said copying machine against the electrophotographic light receiving member in the way as will be under-described.

Evaluation of the environmental stability

This evaluation was made based on resolution in images reproduced.

That is, using a test chart NA-7 (product of CANON KABUSHIKI KAISHA) which contains a plurality of complicated minute Chinese characters respectively of 2 mm in size as an original, an image was reproduced under normal environmental conditions of 23° C. for room temperature and 60% for environmental humidity (hereinafter referred to as "NN-Environment"), under high temperature and high humidity conditions of 32.5° C. for room temperature and 85% for environmental humidity (hereinafter referred to as "HH-Environment") and after 100,000 copying shots under the HH-Environment.

Each of the images reproduced was evaluated while referring to the original.

As a result, it was found that all the images reproduced not only under the NN-Environment but also under the HH-Environment and after 100,000 copying shots under the HH-Environment are highly resolved images equivalent to the test chart in which all the complicated minute Chinese characters of the test chart are sharply reproduced with high resolution, without minute lines being overlapped, and with neither uneven images density nor fogged images.

Figure 7:
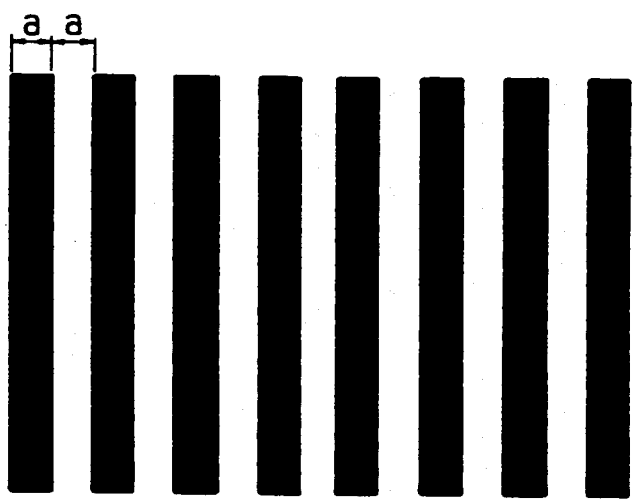
FIG. 7 is an explanatory view of a test chart used for evaluation of environmental stability for electrophotographic light receiving members obtained in Examples and Comparative Examples which will be later described.

Then, using another test chart (product of CANON KABUSHIKI KAISHA) shown in FIG. 7, resolution in an initial image obtained under the NN-Environment, resolution in an initial image obtained under the HH-Environment and resolution in an image obtained after 100,000 copying shots under the HH-Environment were observed.

The test chart shown in FIG. 7 comprises a plurality of black rectangles respectively having a width of "a" being crosswise arranged while leaving a constant white space having a width of "a" between every the two adjacent black rectangles.

The observation of resolution in an image to be reproduced was performed by changing the scale factor of the original image of the test chart to be projected onto the surface of the electrophotographic light receiving member so as to narrow the width "a" by way of adjusting the optical system of the copying machine, reproducing such image in which the width "a" being narrowed, and observing the minimum of the width "a" which can be resolved. Particularly, when the width "a" in the original image of the test chart to be projected onto the surface of the electrophotographic light receiving member is narrowed to a certain extent, the resulting reproduced image becomes impossible to resolve since minute unfocused images of the adjacent black rectangles of the test chart are overlapped. The minimum value of the width "a" in the original image of the test chart which makes it possible to resolve an image reproduced was expressed as the factor for the resolution of the electrophotographic light receiving member.

For the electrophotographic light receiving member, the resolution was stable without depending upon changes in environmental conditions.

In view of this, it was recognized that Sample No. 1 excels in the environmental stability.

The evaluated result was shown in Table 1 in comparison with the electrophotographic light receiving members obtained in the later described Comparative Examples 1 and 2.

Evaluation of the uniformity of images reproduced

This evaluation was made based on the variety in image density. Particularly, using a check sheet G-TEST SHEET-C (product of CANON KABUSHIKI KAISHA) as an original, there was obtained an initial gray color image thereof under the NN-Environment condition. In the gray color image thus obtained, there were randomly selected 100 circle regions respectively of 0.05 mm in diameter. And the number of the circle regions which are uneven in image density among the selected 100 circle regions.

As a result, it was found that the variety in image density for the gray color image is negligible.

The evaluated result was shown in Table 1 in comparison with the electrophotographic light receiving members obtained in the later described Comparative Examples 1 and 2.

Evaluation of the durability of the cleaning blade

This evaluation was made based on the number of the last copy where black line(s) appeared.

Particularly, using the foregoing test chart as an original, image formation was continued until black line(s) appeared in an image reproduced for each of the foregoing five electrophotographic light receiving members. The number of the last copy sheet wherein black line(s) firstly appeared was counted. The resultant numbers were averaged to obtain an mean value.

The evaluated result was shown in Table 1 in comparison with the electrophotographic light receiving members obtained in the later described Comparative Examples 1 and 2.

Independently, observation was made on the presence or absence of Cl radical in the foregoing polysilane compound used for the formation of the surface layer by using a full-automatic X-ray fluorescence analyzing system 3080 (product by Rigakudenki Kohgyo Kabushiki Kaisha). Particularly, there was provided trimethylchlorosilane (product by Chisso Kabushiki Kaisha) as a reference standard, five kinds of control solutions were prepared by diluting said reference standard with respective rates of dilution of 1, 5, 10, 50 and 100 times, each of the control solutions was set to the above X-ray fluorescence analyzing system to measure the amount of Cl radical contained therein, and an analytical curve was obtained based on the measured results.

As for the foregoing polysilane compound used for the formation of the surface layer, 1 g thereof was dissolved in dehydrated toluene to obtain a specimen of 10 ml in a total amount. This was set to the above X-ray fluorescence analyzing system, and the measured result was referred to the foregoing analytical curve to obtain the content (millimolar equivalent/1000 g) of Cl radical.

As a result, it was found that the foregoing polysilane compound does not contain any Cl radical.

COMPARATIVE EXAMPLE 1

The procedures of Example 1 were repeated, except that a polysilane compound, which was obtained by repeating the procedures of Example of Synthesis 1 except for not carrying out the end group treatment with the use of n-hexylchloride, was used for the formation of the surface layer, to thereby obtain a comparative electrophotographic light receiving member.

The electrophotographic light receiving member obtained was evaluated with respect to the environmental stability, uniformity of images reproduced and durability of the cleaning blade in the same manner as in Example 1.

The evaluated results were as shown in Table 1.

In addition, the above polysilane compound used for the formation of the surface layer was examined with respect to the content of Cl radical in accordance with the Cl-content measuring method described in Example 1.

As a result, it was found that said polysilane compound contains Cl radical in such amount as shown in Table 1.

COMPARATIVE EXAMPLE 2

The procedures of Example 1 were repeated, except that the step of forming the surface layer was not conducted, to thereby obtain a comparative electrophotographic light receiving member.

The electrophotographic light receiving member obtained was evaluated with respect to the environmental stability, uniformity of images reproduced and durability of the cleaning blade in the same manner as in Example 1.

The evaluated results were as shown in Table 1.

Total Evaluation

The evaluated results obtained in each of the foregoing Example 1 and Comparative Examples 1-2 were collectively shown in Table 1. In Table 1, each of the values shown therein with respect to the three evaluation items is a relative value obtained when the value obtained in Comparative Example 2 with respective to the corresponding evaluation item was made to be one (1).

From the results shown in Table 1, it was recognized that the electrophotographic light receiving member according to the present invention (obtained in Example 1) which has a light receiving layer comprising a photoconductive layer comprised of Non-Si(H,X) material and a surface layer composed of the specific polysilane compound free of both oxygen and chlorine is apparently surpassing the electrophotographic light receiving member having a light receiving layer composed of Non-Si(H,X) material (obtained in Comparative Example 2) with respect to the durability of the cleaning blade. And the electrophotographic light receiving member obtained in Example 1 is apparently surpassing the electrophotographic light receiving member having a light receiving layer comprising a photoconductive layer composed of Non-Si(H,X) material and a surface layer composed of a polysilane compound containing Cl radical (obtained in Comparative Example 1) with respect to each of the three evaluation items.

EXAMPLE 2

The procedure of Example 1 were repeated to obtain an electrophotographic light receiving member.

The resultant electrophotographic light receiving member was set to the foregoing electrophotographic copying machine NP-7550 for use in evaluation purposes was subjected to image-forming test, using a test chart NA-7 (product of CANON KABUSHIKI KAISHA) which contains a plurality of complicated minute Chinese characters respectively of 2 mm in size as an original.

In the image-forming test, there were reproduced initial images under the NN-Environment condition, initial images under the HH-Environment condition and images after 100000 copying shots under the HH-Environment condition respectively from said test chart.

These reproduced images were evaluated while referring to the complicated minute Chinese characters of the above test chart visually.

As a result, it was found that the images obtained even after 100000 copying shots under the HH-Environment condition are highly resolved images equivalent to the test chart as the original in which all the complicated minute Chinese characters of the test chart are sharply reproduced with high resolution, without minute lines being overlapped, and with neither uneven images density nor fogged images.

In addition, as a result of examining the cleaning blade of the copying machine in the viewpoint of its cleaning efficiency after 100000 copying shots, it was found that the original cleaning efficiency of the cleaning is stably maintained without causing cleaning defects at the surface of the electrophotographic light receiving member which lead to defects on images reproduced even after 100000 copying shots.

Separately, image formation was performed by using a photograph as the original.

As a result, there was repeatedly obtained a desirable reproduction of the photograph excelling in half-tone reproduction and in uniformity and without coarse images even after 100000 copying shots under the HH-Environment condition.

EXAMPLE 3

Figure 4:
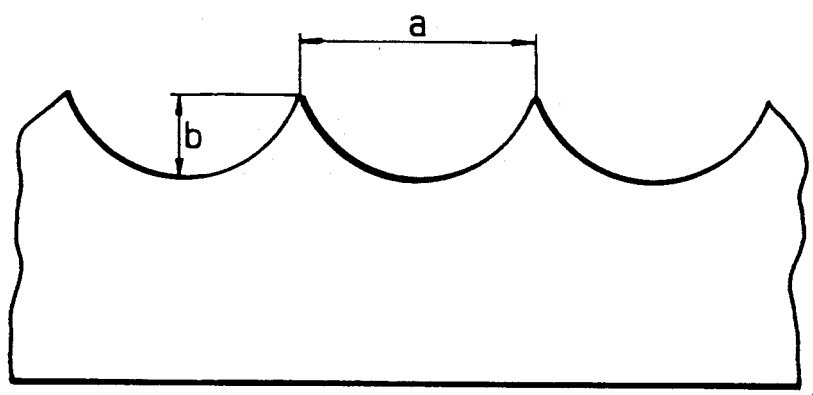
FIG. 4 is a schematic cross-sectional view illustrating the uneven shape comprising a plurality of spherical dimples at the surface of a substrate usable in the electrophotographic light receiving member according to the present invention.

The procedures of Example 1 were repeated, except that a cylindrical aluminum substrate of 80 mm in outer diameter, 358 mm in length and 5 mm in thickness and having an uneven surface of spherical dimples as shown in FIG. 4 wherein a=50 $\mu$m and b=1 $\mu$m was used as the substrate and the conditions for forming the photoconductive layer were changed to those shown in Table 3, to thereby obtain an electrophotographic light receiving member.

The resultant electrophotographic light receiving member was set to a modification of a commercially available electrophotographic copying machine NP-9330 (product of CANON KABUSHIKI KAISHA) for use in experimental purposes to evaluate said light receiving member in the same manner as in Example 2.

The electrophotographic light receiving member provided satisfactory results similar to those obtained in Example 2.

EXAMPLE 4

The procedures of Example 1 were repeated, except that the conditions for forming the photoconductive layer were changed to those shown in Table 4, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 5

The procedures of Example 1 were repeated, except that the conditions for forming the photoconductive layer were changed to those shown in Table 5, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 6

The procedures of Example 1 were repeated, except that Al(CH$_3$)$_3$/He gas and NaNH$_2$/He gas were additionally used as shown in Table 6 for forming the photoconductive layer, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 7

The procedures of Example 1 were repeated, except that a alloy plate composed of 98.7 atomic % of silicon atoms, 0.2 atomic % of chromium atoms, 0.2 atomic % of iron atoms, 0.35 atomic % of magnesium atoms, 0.35 atomic % of sodium atoms and 0.2 atomic % of nickel atoms was disposed on the inner surface of the upper wall 1007 of the deposition chamber 1001 in the way shown by numeral reference 1091 such that said alloy plate be sputtered by glow discharge to release the above atoms upon formation of the photoconductive layer, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 8

Firstly, a coating liquid prepared by dissolving 50 g of the polysilane compound obtained in Example of Synthesis 2 (hereinafter referred to as "polysilane compound No. 2") in 5 l of tetrahydrafuran was applied onto the surface of a cylindrical aluminum substrate of the same size as in Example 1 by the dip coating method in an amount to provide a thickness of 0.1 $\mu$m when dried, followed by air-drying to thereby form a 0.1 $\mu$m thick layer to be the lower layer on the surface of the cylindrical aluminum substrate.

Then, the procedures of Example 1 were repeated to thereby successively form the photoconductive layer and the surface layer on said lower layer.

Thus, there was obtained an electrophotographic light receiving member having a light receiving layer which comprises a lower layer composed of polysilane compound No. 2, a photoconductive layer composed of a non-single crystal silicon material and a surface layer composed of polysilane compound No. 1.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 9

The procedure of Example 1 were repeated, except that the third layer region of the photoconductive layer was not formed and the thickness of the surface layer was changed to 0.7 $\mu$m, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 10

There was prepared an electrophotographic light receiving member of the present invention. The photoconductive layer was formed by using the film-forming apparatus by the microwave glow discharging method shown in FIGS. 5 and 6.

Formation of the Photoconductive Layer

Figure 6:
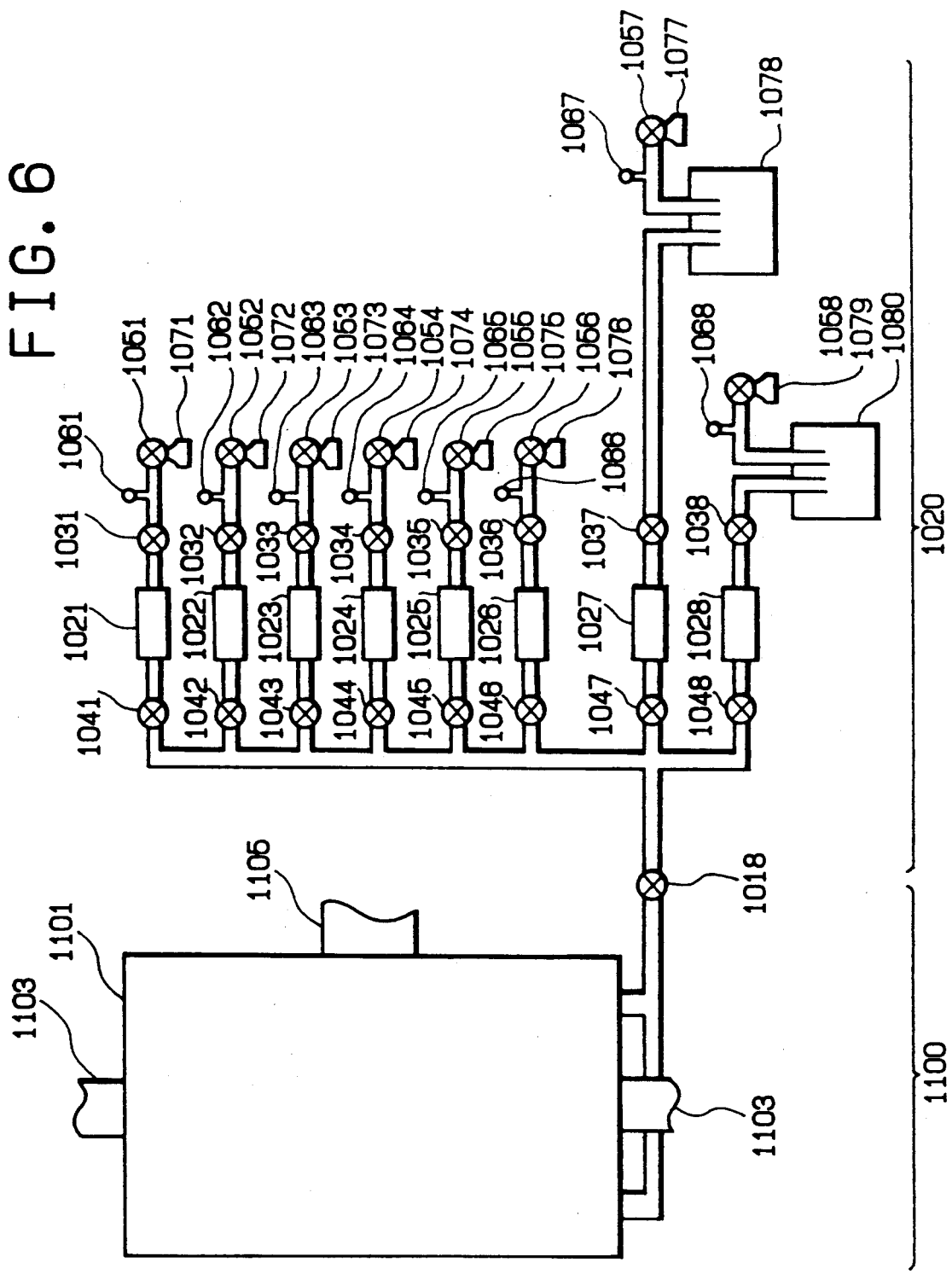
FIG. 6 is a schematic diagram of a system for supplying film-forming raw material gases into the film-forming chamber shown in FIG. 5.

There was formed a photoconductive layer comprising a first layer region, a second layer region and a third layer region on a plurality of cylindrical aluminum substrates respectively of 108 mm in outer diameter, 358 mm in length and 5 mm in thickness and having a mirror-ground surface under film-forming conditions shown in Table 7, using the apparatus shown in FIGS. 5 and 6.

FIG. 5 is a schematic perspective view of the constitution of a microwave plasma CVD system, wherein numeral reference 1100 stands for the entire of said system. This microwave plasma CVD system corresponds to the part expressed by numeral reference 1100 in FIG. 6. In FIG. 6, numeral reference 1020 stands for a gas supply system which is the same as in FIG. 3. In FIG. 5, numeral reference 1101 stands for a substantially enclosed deposition chamber wherein said plurality of cylindrical aluminum substrates 1107 being arranged so as to circumscribe a microwave discharge space 1109. Each of the cylindrical aluminum substrate 1107 is placed on a rotatable cylindrical substrate holder provided an electric heater therein (not shown). Numeral reference 1110 stands for a gas feed pipe provided with a plurality of gas liberation holes (not shown) capable of spouting a film-forming raw material gas into the discharge space 1109.

The gas feed pipe 1110 is arranged between the two adjacent cylindrical substrate holders. The gas feed pipe 1110 is connected through a gas supply pipe provided with a sub-valve 1018 to the gas supply system 1020 shown in FIG. 6. The deposition chamber 1101 is provided with an exhaust pipe 1105 being connected through an exhaust valve (not shown) to a vacuum pump (not shown). The deposition chamber 1101 is provided with a microwave introducing window being connected through a waveguide 1103 to a microwave power source (not shown). Numeral reference 1104 stands for the direction of microwave to propagate.

In the gas supply system 1020 shown in FIG. 6, gas reservoirs 1071, 1072, 1073, 1074, 1075, and 1076 are charged with film-forming raw material gases for forming the respective layer regions, that is, SiH$_4$ gas (99.999% purity) in the reservoir 1071, H$_2$ gas (99.9999% purity) in the reservoir 1072, CH$_4$ gas (99.999% purity) in the reservoir 1073, SiF$_4$ gas (99.999% purity) in the reservoir 1074, B$_2$H$_6$ gas (99.999% purity) diluted with H$_2$ gas (hereinafter referred to as "B$_2$H$_6$/H$_2$ gas") in the reservoir 1075, and NO gas (99.999% purity in the reservoir 1076.

Each of gas reservoirs 1077 and 1079 is charged with He gas (99.999%). Substantially enclosed vessel 1078 contains Al(CH$_3$)$_3$ (99.99% purity) therein, and substantially enclosed vessel 1080 contains NaNH$_2$ (99.99% purity).

In the above apparatus, prior to the entrance of film-forming raw material gases into the discharge space 1109, it is confirmed that valves 1051 through 1058 of the gas reservoirs 1071 through 1077 and 1079, inlet valves 1031 through 1038, and the leak value 1016' are closed and that exit valves 1041 through 1048 and the sub-valve 1018 are opened. Then, the exhaust valve 1016 is opened and the vacuum pump (not shown) is actuated to evacuate the inside of the deposition chamber 1001 and the gas pipe ways. Upon observing that the reading on a vacuum gage (not shown) became about 5×10$^{-6}$ Torr, the sub-valve 1018 and the outlet valves 1041 through 1048 are closed.

In the case of introducing film-forming raw material gases into the reaction space upon film formation, the apparatus is operated, for instance, in the following way.

SiH$_4$ gas from the reservoir 1071, H$_2$ gas from the reservoir 1072, CH$_4$ gas from the reservoir 1073, GeH$_4$ gas from the reservoir 1074, B$_2$H$_6$/H$_2$ gas from the reservoir 1075, NO gas from the reservoir 1076, and He gas from the reservoirs 1077 and 1079 are caused to flow into mass flow controllers 1021 through 1028 by opening the valves 1051 through 1058 and the inlet valves 1031 through 1038 while controlling each of the pressures of exit gages 1061 through 1068 to about 2 kg/cm$^2$. In this case, He gas from the reservoir 1077 is introduced into the vessel 1078 containing Al(CH$_3$)$_3$ to cause a gas comprising Al(CH$_3$)$_3$ gasified with He gas (hereinafter referred to as "Al(CH$_3$)$_3$/He gas"), which is followed by flowing into the mass flow controller 1029. Likewise, He gas from the reservoir 1079 is introduced into the vessel 1080 containing NaNH$_2$ to cause a gas comprising NaNH$_2$ gasified with He gas as (hereinafter referred to as "NaNH$_2$/He gas"), which is followed by flowing into the mass flow controller 1028. Subsequently, the exit valves 1041 through 1048, and the sub-valve 1018 are gradually opened to enter the gases into the deposition chamber 1101 through the gas feed pipes 1110. In this case, the exit valves 1041 through 1048 are adjusted so as to attain a desired value for the ratio among the flow rates of the gases, and the opening of the exhaust valve (not shown) is adjusted while observing the reading on the vacuum gage (not shown) so as to attain a desired value for the gas pressure of the discharge space 1109. Then, after confirming that the temperature of each of the aluminum substrates 1107 being rotated by a driving motor (not shown) is maintained at a predetermined temperature (for example at about 250° C.) by the electric heater (not shown), a predetermined microwave power is applied through the microwave introducing window 1102 into the discharge space 1109 to cause microwave glow discharge therein while controlling the flow rates of the gases in accordance with a previously designed variation coefficient curve by using a microcomputer (not shown).

Now, reference is made in the following to an example of forming the foregoing photoconductive layer.

The photoconductive layer was formed under the conditions shown in Table 7.

Firstly, the first layer region was formed on each of the foregoing cylindrical aluminum substrates in accordance with the manner as above explained. That is, the exit valves 1041, 1042, 1044, 1045 and 1046, and the sub-valve 1018 were gradually opened to introduce SiH$_4$ gas, H$_2$ gas, SiF$_4$ gas, B gas and NO gas through the gas feed pipes 1110 into the discharge space 1109 of the deposition chamber 1001. In this case, the flow rate of the SiH$_4$ gas, the flow rate of the H$_2$ gas, the flow rate of the SiF$_4$ gas, the flow rate of the B$_2$H$_6$/H$_2$ gas and the flow rate of the NO gas were controlled to 230 SCCM, 150 SCCM, 20 SCCM, 500 ppm (against the SiH$_4$ gas) and 10 SCCM respectively by adjusting the mass flow controllers 1021, 1022, 1024, 1025 and 1026.

The gas pressure (inner pressure) in the deposition chamber 1101 was controlled to 0.5 mTorr by reguarating the opening of the exhaust valve while observing the reading on the vacuum gage. Each of the aluminum substrates was maintained at 250° C. Then, a microwave power of 0.5 W/cm$^3$ was applied into the discharge space 1109 of the deposition chamber 1101 through the microwave introducing window 1102 to cause microwave glow discharge in the discharge space 1109, whereby forming a 3 μm thick layer to be the first layer region on each of the cylindrical aluminum substrates.

After the formation of the first layer region being completed, the application of the microwave power was suspended, and the exit valves 1041, 1042, 1044, 1045 and 1046, and the sub-valve 1018 were closed.

Then, a layer to be the second layer region was formed on the previously formed first layer region. Subsequent to the procedures as above described, the exit valves 1041, 1042, 1044 and 1045 and the sub-valve 1018 were opened to introduce SiH$_4$ gas, H$_2$ gas, SiF$_4$ gas and B$_2$H$_6$/H$_2$ gas into the discharge space 1109 of the deposition chamber 1101 at respective flow rates of 700 SCCM, 500 SCCM, 30 SCCM and 1 ppm (against the SiH$_4$ gas) by adjusting the mass flow controllers 1021, 1022, 1024 and 1025. The gas pressure (inner pressure) in the deposition chamber 1101 was controlled to 0.5 mTorr by regulating the opening of the exhaust valve while observing the reading on the vacuum gage. The substrate having the first layer region thereon was maintained at 250° C. Then, a microwave power of 0.5 W/cm$^3$ was applied into the discharge space 1109 through the microwave introducing window to cause microwave glow discharge in the discharge space, whereby forming a 2 μm thick layer to be the second layer region on the surface of the first layer region.

After the formation of the second layer region being completed, the application of the RF power was suspended, and the exit valves 1041, 1042, 1044 and 1045 and the sub-valve 1018 were closed.

Then, a layer to be the third layer region was formed on the previously formed second layer region. Subsequent to the procedures as above described, the exit valves 1041 and 1043 and the sub-valve 1018 were opened to introduce SiH$_4$ gas and CH$_4$ gas into the discharge space 1109 at respective flow rates of 150 SCCM and 500 SCCM by adjusting the mass flow controllers 1021 and 1023. The gas pressure (inner pressure) in the deposition chamber 1101 was controlled to 0.3 mTorr by regulating the opening of the exhaust valve while observing the reading on the vacuum gage. The substrate having the first and second layer regions thereon was maintained at 250° C. Then, a microwave power of 0.5 W/cm$^3$ was applied into the discharge space 1109 through the microwave introducing window 1102 to cause microwave glow discharge in the discharge space, whereby forming a 1 μm thick layer to be the third layer region on the surface of the second layer region.

After the formation of the third layer region being completed, the application of the microwave power was terminated, and the exit valves 1041 and 1043 and the sub-valve 1018 were closed.

The conditions for forming each of the first, second and third layer regions were collectively shown in Table 7.

In the above procedures of forming each of the first, second and third layer regions, all the exit valves other than those required for upon forming the respective layer regions were of course closed. Further, upon forming the respective layer regions, the inside of the system was once evacuated to a high vacuum degree as required by closing the exit valves 1041 through 1048 while opening the sub-valve 1018 and fully opening the exhaust valve for avoiding the gases having been used for the formation of the previous layer were left in the deposition chamber 1101 and in the pipe ways from the exit valves 1041 through 1048 to the inside of the deposition chamber 1101.

Further, during the layer forming operation, each of the cylindrical aluminum substrates 1107 was rotated at a predetermined speed by the driving motor (not shown).

Formation of the Surface Layer

The cylindrical aluminum substrates respectively having the photoconductive layer formed thereon in the above was taken out from the deposition chamber 1101, and a 0.2 μm thick surface layer was formed on the photoconductive layer with the use of the polysilane compound obtained in the foregoing Example of Synthesis 1 (polysilane compound No. 1) in the following way.

50 g of the polysilane compound No. 1 was dissolved in 5 l of tetrahydrofuran to obtain a coating liquid.

The coating liquid was applied onto the surface of the photoconductive layer formed on each of the cylindrical aluminum substrates by a dip coating method in an amount to provide a 0.2 μm thickness when dried, followed by air-drying to thereby form a 0.2 μm thick layer to be the surface layer on the photoconductive layer.

Thus, there were obtained eight electrophotographic light receiving members.

Each of the eight electrophotographic light receiving members thus obtained was set to the foregoing modification of the electrophotographic copying machine NP-7550 to evaluate the light receiving member in the same manner as in Example 2.

As a result, each of the eight electrophotographic light receiving members provided satisfactory results similar to those obtained in Example 2.

EXAMPLE 11

The procedures of Example 10 were repeated, except that each of the cylindrical substrates was changed to a cylindrical aluminum substrate of 80 mm in outer diameter, 358 mm in length and 5 mm in thickness and having an uneven surface of spherical dimples as shown in FIG. 4 wherein a=50 μm and b=1 μm, the polysilane compound No. 1 used for the formation of the surface layer was replaced by the polysilane compound obtained in Example of Synthesis 2 and the thickness of the surface was changed to 0.1 μm, to thereby obtain eight electrophotographic light receiving members.

Each of the eight electrophotographic light receiving members thus obtained was set to the foregoing modification of the electrophotographic copying machine NP-9330 to evaluate the light receiving member in the same manner as in Example 2.

As a result, each of the eight electrophotographic light receiving members provided satisfactory results similar to those obtained in Example 2.

EXAMPLE 12

The procedures of Example 1 were repeated, except that the conditions for the formation of the photoconductive layer were changed to those shown in Table 4, the polysilane compound No. 1 to be used for the formation of the surface layer was replaced by the polysilane compound obtained in Example of Synthesis 3 and the thickness of the surface layer was changed to 0.5 μm, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 13

The procedures of Example 1 were repeated, except that the conditions for the formation of the photoconductive layer were changed to those shown in Table 5, the polysilane compound No. 1 to be used for the formation of the surface layer was replaced by the polysilane compound obtained in Example of Synthesis 4 and the thickness of the surface layer was changed to 0.05 μm, to thereby obtain an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 14

There was prepared an electrophotographic light receiving member by repating the procedures of Example 1.

The resultant electrophotographic light receiving member was placed on the substrate holder in the deposition chamber 1001 of the apparatus shown in FIG. 3. Then, the reaction space of the deposition chamber 1001 was evacuated to a vacuum of about $5 \times 10^{-6}$ Torr. The cylindrical substrate was maintained at 50° C. by actuating the electric heater 1014.

Thereafter, AsF$_5$ gas diluted with Ar gas (AsF$_5$ gas/Ar gas=30%) was introduced through an additional gas supply pipe (not shown) into the deposition chamber 1001 until the gas pressure in the deposition chamber became 200 Torr. The electrophotographic light receiving member was allowed to stand for 5 minutes, to thereby penetrate AsF$_5$ as an acceptor impurity into the surface layer composed of the polysilane compound No. 1.

Thus, there was obtained an electrophotographic light receiving member having the surface layer composed of the polysilane compound incorporated with AsF$_5$ as the acceptor impurity.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

EXAMPLE 15

The procedures for the formation of the photoconductive layer in Example 1 were repeated, except that the conditions for the formation of the photoconductive layer were changed to those shown in Table 4, to thereby form a photoconductive layer composed of a non-single crystal silicon material on a cylindrical aluminum substrate. The cylindrical aluminum substrate having the photoconductive layer formed thereon was taken out from the deposition chamber, and a 0.4 μm thick surface layer was formed on the photoconductive layer with the use of the polysilane compound No. 1 obtained in the foregoing Example of Synthesis 1 in the following way.

50 g of the polysilane compound was dissolved in 5 l of tetrahydrafuran to obtain a liquid, to which a dopant liquid obtained by dissolving 50 mg of triphenylamine as a donor impurity in 100 ml of dehydrated benzene was added, followed by stirring, to thereby obtain a coating liquid.

The coating liquid was applied onto the surface of the photoconductive layer formed on the cylindrical aluminum substrate by a dip coating method in an amount to provide a 0.4 μm thickness when fried, followed by air-drying to thereby form a 0.4 μm thick layer to be the surface layer on the photoconductive layer.

Thus, there was obtained an electrophotographic light receiving member.

The resultant electrophotographic light receiving member was set to the foregoing modification of the electrophotographic copying machine NP-7550 to evaluate said light receiving member in the same manner as in Example 2.

The electrophotographic light receiving member provided satisfactory results similar to those obtained in Example 2.

TABLE 1

|  | Cl-content of the polysilane compound used (millimolar equivalent/1000 g) | environmental stability | uniformity of an image reproduced | durability of a cleaning blade |
| --- | --- | --- | --- | --- |
| Example 1 | 0 | 1.07 | 1.02 | 1.83 |
| Comparative Example 1 | 26 | 0.80 | 0.70 | 1.12 |
| Comparative | — | 1.00 | 1.00 | 1.00 |

TABLE 1-continued

|  | Cl-content of the polysilane compound used (millimolar equivalent/1000 g) | environmental stability | uniformity of an image reproduced | durability of a cleaning blade |
|---|---|---|---|---|
| Example 2 |  |  |  |  |

Note
Each of the values mentioned with respect to Example 1 and Comparative Example 1 is a relative value obtained when the value obtained in Comparative Example 2 with respect to the corresponding evaluation item was made to be one (1).

TABLE 2

| substrate | aluminum cylinder of 108 mm φ in outer diameter, 358 mm in length and 5 mm in thickness and having a mirror-ground surface | | | | | |
|---|---|---|---|---|---|---|
|  |  | gas used and its flow rate | substrate temperature (°C.) | RF power (mW/cm$^3$) | inner pressure (Torr) | layer thickness (μm) |
| conditions for forming the photoconductive layer |  |  |  |  |  |  |
| 1st layer region | SiH$_4$ | 100 | 250 | 10 | 0.4 | 3 |
|  | H$_2$ | 500 |  |  |  |  |
|  | B$_2$H$_6$/H$_2$ (against SiH$_4$) | 1200 ppm |  |  |  |  |
|  | NO | 5 |  |  |  |  |
| 2nd layer region | SiH$_4$ | 600 | 250 | 10 | 0.6 | 25 |
|  | B$_2$H$_6$/H$_2$ (against SiH$_4$) | 0.6 ppm |  |  |  |  |
|  | H$_2$ | 600 |  |  |  |  |
| 3rd layer region | SiH$_4$ | 50 | 250 | 10 | 0.4 | 0.5 |
|  | CH$_4$ | 500 |  |  |  |  |
| conditions for forming the surface layer | The polysilane compound No. 1 was diluted with 10 parts by weight of toluene to obtain a coating liquid. The coating liquid was applied onto the surface of the photoconductive layer in an amount to provide a 0.2 μm thickness when dried by a dip coating method. | | | | | |

TABLE 3

|  | gas used and its flow rate (sccm) | | substrate temperature (°C.) | RF power (mW/cm$^3$) | inner pressure (Torr) | layer thickness (μm) |
|---|---|---|---|---|---|---|
| 1st layer region | SiH$_4$ | 100 | 250 | 10 | 0.4 | 1 |
|  | H$_2$ | 100 |  |  |  |  |
|  | B$_2$H$_6$/H$_2$ (against SiH$_4$) | 500 ppm |  |  |  |  |
|  | NO | 8→5 (constantly decreased) |  |  |  |  |
|  | GeH$_4$ (in the side of the substrate: 0.7 μm) | 50 |  |  |  |  |
|  | (in the side of the 2nd layer region: 0.3 μm) | 50→0 (constantly decreased) |  |  |  |  |
| 2nd layer region | SiH$_4$ | 100 | 250 | 10 | 0.4 | 3 |
|  | B$_2$H$_6$/H$_2$ (against SiH$_4$) | 800 ppm |  |  |  |  |
|  | NO | 5→0 (constantly decreased) |  |  |  |  |
|  | H$_2$ | 100 |  |  |  |  |
| 3rd layer region | SiH$_4$ | 300 | 250 | 15 | 0.5 | 20 |
|  | B$_2$H$_6$/H$_2$ (against SiH$_4$) | 0.2 ppm |  |  |  |  |
|  | H$_2$ | 300 |  |  |  |  |
| 4th layer region | SiH$_4$ | 200→50 (constantly decreased) | 250 | 10 | 0.4 | 0.5 |
|  | CH$_4$ | 10→500 (constantly increased) |  |  |  |  |

TABLE 4

| | gas used and its flow rate (sccm) | | substrate temperature (°C.) | RF power (mW/cm³) | inner pressure (Torr) | layer thickness (μm) |
|---|---|---|---|---|---|---|
| 1st layer region | SiH$_4$<br>H$_2$<br>PH$_3$/H$_2$<br>(against SiH$_4$) | 300<br>500<br>500 ppm | 250 | 20 | 0.5 | 3 |
| 2nd layer region | SiH$_4$<br>B$_2$H$_6$/H$_2$<br>(against SiH$_4$)<br>H$_2$ | 300<br>0.1 ppm<br><br>500 | 250 | 20 | 0.5 | 25 |
| 3rd layer region | SiH$_4$<br>CH$_4$<br>B$_2$H$_6$/H$_2$<br>(against SiH$_4$) | 200<br>200<br>300 ppm | 250 | 10 | 0.4 | 0.3 |
| 4th layer region | SiH$_4$<br>CH$_4$ | 50<br>500 | 250 | 10 | 0.4 | 0.2 |

TABLE 5

| | gas used and its flow rate (sccm) | | substrate temperature (°C.) | RF power (mW/cm³) | inner pressure (Torr) | layer thickness (μm) |
|---|---|---|---|---|---|---|
| 1st layer region | SiH$_4$<br>H$_2$<br>B$_2$H$_6$/H$_2$<br>(against SiH$_4$)<br>C$_2$H$_2$ | 100<br>700<br>5 ppm<br><br>10 | 280 | 35 | 0.4 | 20 |
| 2nd layer region | SiH$_4$<br>B$_2$H$_6$/H$_2$<br>(against SiH$_4$)<br>H$_2$<br>C$_2$H$_2$ | 100<br>1 ppm<br><br>700<br>10→0<br>(constantly decreased) | 280 | 25 | 0.4 | 1 |
| 3rd layer region | SiH$_4$<br>B$_2$H$_6$/H$_2$<br>(against SiH$_4$)<br>H$_2$ | 300<br>0.3 ppm<br><br>300 | 280 | 15 | 0.5 | 2 |
| 4th layer region | SiH$_4$<br>CH$_4$ | 50<br>500 | 280 | 10 | 0.4 | 0.5 |

TABLE 6

| | gas used and its flow rate (sccm) | |
|---|---|---|
| 1st layer region | Al(CH$_3$)$_3$/He<br>NaNH$_2$/He | 15<br>2 |
| 2nd layer region | Al(CH$_3$)$_3$/He<br>NaNH$_2$/He | 5<br>1 |
| 3rd layer region | Al(CH$_3$)$_3$/He<br>NaNH$_2$/He | 2<br>1 |

TABLE 7

| | gas used and its flow rate (sccm) | | substrate temperature (°C.) | μW power (W/cm³) | inner pressure (Torr) | layer thickness (μm) |
|---|---|---|---|---|---|---|
| 1st layer region | SiH$_4$<br>H$_2$<br>B$_2$H$_6$/H$_2$<br>(against SiH$_4$)<br>SiF$_4$<br>NO | 230<br>150<br>500 ppm<br><br>20<br>10 | 220 | 0.5 | 0.5 | 3 |
| 2nd layer region | SiH$_4$<br>SiF$_4$<br>B$_2$H$_6$/H$_2$<br>(against SiH$_4$)<br>H$_2$ | 700<br>30<br>11 ppm<br><br>500 | 220 | 0.5 | 0.5 | 22 |
| 3rd layer region | SiH$_4$<br>CH$_4$ | 150<br>500 | 250 | 0.5 | 0.3 | 1 |

What we claim is:
1. An electrophotographic light receiving member comprising a substrate and a light receiving layer having a multi-layered structure disposed on said substrate, said light receiving layer comprising at least a photoconductive layer and a surface layer being stacked in this order from the side of said substrate, said photoconductive layer being formed of a non-single crystal material containing silicon atoms as the matrix and at least one kind of atoms selected from the group consisting of hydrogen atoms and halogen atoms, and said surface layer being formed of an oxygen-free polysilane compound having a weight average molecular weight of 6,000 to 200,000 which is formed by (a) contacting dichlorosilane monomer with a condensation catalyst comprising an alkaline metal in an inactive atmosphere which is free of oxygen and water to dehalogenate and condensation polymerize said dichlorosilane monomer to form an intermediate polymer of high purity; (b) separating said intermediate polymer from unreacted dichlorosilane monomer; and (c) reacting said separated intermediate polymer with a halogenating organic reagent selected from the group consisting of halogenated alkyl compounds, halogenated aryl compounds and halogenated aralkyl compounds in the presence of a condensation catalyst comprising an alkaline metal to condense organic groups on the terminals of said intermediate polymer, said oxygen-free polysilane compound having the following formula (I):

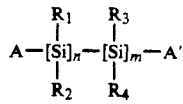

wherein, $R_1$ is an alkyl group of 1 to 2 carbon atoms; $R_2$ is an alkyl group, cycloalkyl group, aryl group or aralkyl group of 3 to 8 carbon atoms; $R_3$ is an alkyl group of 1 to 4 carbon atoms; $R_4$ is an alkyl group of 1 to 4 carbon atoms; A and A' are each an alkyl group, cycloalkyl group, aryl group or aralkyl group of 4 to 12 carbon atoms, wherein A and A' are the same or different, each of n and m is a mole ratio of the proportion of the number of monomers based on the total of the monomers in the polysilane compound and $0 < n \leq 1$, $0 \leq m < 1$ and $(n+m)=1$.

2. An electrophotographic light receiving member according to claim 1, wherein the surface layer contains an acceptor impurity and/or a donor impurity.

3. An electrophotographic light receiving member according to claim 1 wherein the light receiving layer further comprises a lower layer below the photoconductive layer, said lower layer being formed of said oxygen-free polysilane compound.

* * * * *

UNITED STATES PATENT AND TRADEMARK OFFICE
CERTIFICATE OF CORRECTION

PATENT NO. : 5,236,798
DATED : August 17, 1993
INVENTOR(S) : TATSUYUKI AOIKE, ET AL.

Page 1 of 8

It is certified that error appears in the above-identified patent and that said Letters Patent is hereby corrected as shown below:

COLUMN 1

Line 13, "exhibit" should read --exhibits--.
Line 31, ""a-si)." should read --"a-Si").--.
Line 32, "electro-photographic" should read --electrophotographic--.
Line 34, ""a-si." should read --a-Si.--.
Line 39, ""a-si." should read --a-Si.--.
Line 41, ""a-si" should read --a-Si--.
Line 47, ""a-si" (first occurrence) should read --a-Si-- and ""a-si" (second occurrence) should read --"a-Si--.
Line 51, "photoresponsibility" should read --photoresponsiveness--.
Line 54, ""a-si" should read --a-Si--.

COLUMN 3

Line 30, "a" should read --an--.
Line 44, "repeating" should read --repeated--.
Line 61, "Other" should read --Another--.

COLUMN 4

Line 13, "repeating" should read --repeated--.

COLUMN 5

Line 41, "repeating" should read --repeated--.
Line 43, "In a" should read --A--.

UNITED STATES PATENT AND TRADEMARK OFFICE
CERTIFICATE OF CORRECTION

PATENT NO. : 5,236,798
DATED : August 17, 1993
INVENTOR(S) : TATSUYUKI AOIKE, ET AL.

It is certified that error appears in the above-identified patent and that said Letters Patent is hereby corrected as shown below:

COLUMN 7

Line 22, "atoms, (N)," should read --atoms (N),--.
Line 46, "they" should read --that they--.
Line 47, "entire" should read --entirety--.
Line 58, "form" should read --from--.

COLUMN 8

Line 47, "there into" should read --thereinto--.
Line 50, "$1 \times 10^{-1}$ $1 \times 10^{3}$" should read --$1 \times 10^{-3}$ to $1 \times 10^{3}$--.

COLUMN 9

Line 28, "(H,X)" should read --(H+X)--.
Line 50, "a" should read --an--.
Line 51, "sum(H.X)" should read --sum (H+X)--.
Line 62, "atoms of Ca," should read --atoms of Cu,--.

COLUMN 10

Line 1, "Cr atoms," should be deleted.
Line 32, "method e.g." should read --method, e.g.--.
Line 48, "formed" should read --form--.

COLUMN 12

Line 54, "atoms." should read --atoms (X).--.

COLUMN 13

Line 68, "$B_6H_{14}$" should read -- "$B_6H_{14}$:" --.

UNITED STATES PATENT AND TRADEMARK OFFICE
CERTIFICATE OF CORRECTION

PATENT NO. : 5,236,798

DATED : August 17, 1993

INVENTOR(S) : TATSUYUKI AOIKE, ET AL.

It is certified that error appears in the above-identified patent and that said Letters Patent is hereby corrected as shown below:

COLUMN 14

Line 1, "$BBr_3$:" should read -- $BBr_3$;--.
Line 5, "$P_2H_6$" should read -- "$P_2H_6$:".
Line 6, "$PI_3$:" should read --$PI_3$;--.
Line 14, "$the_2$," should read --$TeH_2$,--.
Line 39, "butine ($C_4H_6$)" should read --butyne ($C_4H_6$).--.
Line 51, "($NH_4N_3$)" should read --($NH_4N_3$).--.
Line 66, "ane($H_3SiOSiH_2OSiH_4$," should read
--ane ($H_3SiOSiH_2OSiH_4$),--.

COLUMN 15

Line 7, "$GeCl_4$," should read --$GeF_4$, $GeCl_4$,--.
Line 17, "$snHCl_3$," should read --$SnHCl_3$,--.
Line 57, "atoms(Zn) Diethyl zinc $ZnC_2H_5)_2$" should read
--atoms(Zn). Diethyl zinc $Zn(C_2H_5)_2$--.

COLUMN 16

Line 63, "phenetyl" should read --phenethyl--.

COLUMN 17

Line 30, "repeating" should read --repeated--.

COLUMN 18

Line 26, "whereby" should read --thereby--.
Line 32, "power" should read --powder--.
Line 55, "case" should read --cause--.

UNITED STATES PATENT AND TRADEMARK OFFICE
CERTIFICATE OF CORRECTION

PATENT NO. : 5,236,798
DATED : August 17, 1993
INVENTOR(S) : TATSUYUKI AOIKE, ET AL.

Page 4 of 8

It is certified that error appears in the above-identified patent and that said Letters Patent is hereby corrected as shown below:

COLUMN 20

Line 2, "whereby" should read --thereby--.
Line 32, "the use of" should be deleted.

COLUMN 21

Line 17, "example" should read --examples--.
Line 27, "amines" should read --amines represented--.

COLUMN 22

Line 2, "acceptor" should read --impurity--.
Line 13, "acceptor" should read --impurity--.

COLUMN 29

Line 63, "regards" should read --regard--.

COLUMN 30

Line 27, "and0.3" should read --and 0.3--.
Line 50, "by" should read --of--.

COLUMN 31

Line 3, "by" should read --of--.
Line 24, "--(-CH$_2$-)$_4$ to" should read --to -(-CH$_2$-)$_4$--.
Line 63, "decantated." should read --decanted.--.
Line 67, "by" should read --of--.

UNITED STATES PATENT AND TRADEMARK OFFICE
CERTIFICATE OF CORRECTION

PATENT NO. : 5,236,798
DATED : August 17, 1993
INVENTOR(S) : TATSUYUKI AOIKE, ET AL.

It is certified that error appears in the above-identified patent and that said Letters Patent is hereby corrected as shown below:

COLUMN 32

Line 13, "Synthesis." should read --Synthesis 1.--.
    Line 17, "11250 $cm^{-1}$" should read --1150 $cm^{-1}$--.
    Line 51, "by" should read --of--.
    Line 66, "sis." should read --sis 1.--.

COLUMN 33

Line 11, "synthesis 1." should read --Synthesis 1.--.
    Line 17, "si-phenyl" should read --Si-phenyl--.
    Line 34, "by" should read --of--.
    Line 40, "FT-IUR" should read --FT-IR--.
    Line 42, "Synthesis." should read --Synthesis 1.--.

COLUMN 34

Line 11, "member" should read --members--.
    Line 33, "purity" should read --purity)--.
    Line 49, "sub-value 1018," should read --sub-valve 1018,--.

COLUMN 35

Line 1, "pipe ways." should read --pipeways.--.
    Line 25, "as" should be deleted.
    Line 48, "layer" should read --layers.--.
    Line 66, "reguarating" should read --regulating--.

COLUMN 36

Line 4, "whereby" should read --thereby--.
    Line 28, "whereby" should read --thereby--.

UNITED STATES PATENT AND TRADEMARK OFFICE
CERTIFICATE OF CORRECTION

PATENT NO.  : 5,236,798
DATED       : August 17, 1993
INVENTOR(S) : TATSUYUKI AOIKE, ET AL.

It is certified that error appears in the above-identified patent and that said Letters Patent is hereby corrected as shown below:

COLUMN 36

Line 51, "whereby" should read --thereby--.
Line 59, "were" should read --are--.
Line 63, "upon" should be deleted.

COLUMN 37

Line 3, "pipe ways" should read --pipeways--.

COLUMN 38

Line 20, "the" should be deleted.
Line 62, "regions." should read --regions was noted.

COLUMN 39

Line 11, "an" should read --a--.

COLUMN 40

Line 10, "were" should read --are--.
Line 14, "respective" should read --respect--.
Line 39, "procedure" should read --procedures--.
Line 44, "was" should read --and was--.
Line 64, "images" should read --image--.

COLUMN 41

Line 1, "ing" should read --ing blade--.

UNITED STATES PATENT AND TRADEMARK OFFICE
CERTIFICATE OF CORRECTION

PATENT NO. : 5,236,798

DATED : August 17, 1993

INVENTOR(S) : TATSUYUKI AOIKE, ET AL.

It is certified that error appears in the above-identified patent and that said Letters Patent is hereby corrected as shown below:

COLUMN 42

Line 12, "a" should read --an--.
    Line 36, "tetrahydrafuran" should read --tetrahydrofuran--.
    Line 62, "procedure" should read --procedures--.

COLUMN 43

Line 26, "entire of said" should read --entire--.
    Line 35, "substrate" should read --substrates--.
    Line 65, "purity" should read --purity)--.

COLUMN 44

Line 12, "pipe ways." should read --pipeways.--.
    Line 36, "as" should be deleted.
    Line 68, "B gas" should read --$B_2H_6/H_2$ gas--.

COLUMN 45

Line 10, "reguarat-" should read --regulat- --.
    Line 18, "whereby" should read --thereby--.
    Line 42, "whereby" should read --thereby--.
    Line 64, "whereby" should read --thereby--.

COLUMN 46

Line 4, "were" should read --are--.
    Line 8, "upon" should be deleted.
    Line 16, "pipe ways" should read --pipeways--.
    Line 27, "was" should read --were--.

UNITED STATES PATENT AND TRADEMARK OFFICE
CERTIFICATE OF CORRECTION

PATENT NO. : 5,236,798
DATED : August 17, 1993
INVENTOR(S) : TATSUYUKI AOIKE, ET AL.

It is certified that error appears in the above-identified patent and that said Letters Patent is hereby corrected as shown below:

<u>COLUMN 48</u>

Line 36, "tetrahydrafuran" should read --tetrahydrofuran--.
Line 44, "fried," should read --dried,--.

<u>COLUMN 49</u>

TABLE 3, "$B_2H_{6/H2}$" should read --$B_2H_6/H_2$--.

<u>COLUMN 51</u>

TABLE 6, "$Al(CH_3)_{3/He}$" should read --$Al(CH_3)_3/He$--.

<u>COLUMN 54</u>

Line 22, "claim 1" should read --claim 1,--.

Signed and Sealed this

Twenty-second Day of February, 1994

Attest:

BRUCE LEHMAN

*Attesting Officer*  *Commissioner of Patents and Trademarks*